US011785706B2

(12) United States Patent
Asl et al.

(10) Patent No.: US 11,785,706 B2
(45) Date of Patent: Oct. 10, 2023

(54) INTERLACED CROSSTALK CONTROLLED TRACES, VIAS, AND CAPACITORS

(71) Applicant: Cisco Technology, Inc., San Jose, CA (US)

(72) Inventors: Shadi Ebrahimi Asl, Cary, NC (US); Stephen Aubrey Scearce, Apex, NC (US); Quinn Gaumer, Durham, NC (US); Linda W. Scott, Winter Springs, FL (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 21 days.

(21) Appl. No.: 17/335,591

(22) Filed: Jun. 1, 2021

(65) Prior Publication Data

US 2022/0386452 A1 Dec. 1, 2022

(51) Int. Cl.
*H05K 1/02* (2006.01)
*H05K 1/11* (2006.01)
*H05K 1/18* (2006.01)
*H05K 3/00* (2006.01)
(Continued)

(52) U.S. Cl.
CPC ......... *H05K 1/0218* (2013.01); *H05K 1/0298* (2013.01); *H05K 1/115* (2013.01); *H05K 1/181* (2013.01); *H05K 3/0047* (2013.01); *H05K 3/303* (2013.01); *H05K 3/42* (2013.01);
(Continued)

(58) Field of Classification Search
CPC .... H05K 1/0218; H05K 1/0298; H05K 1/115; H05K 1/181; H05K 3/0047; H05K 3/303; H05K 3/42; H05K 2201/10015
See application file for complete search history.

(56) References Cited

U.S. PATENT DOCUMENTS 4,581,301 A * 4/1986 Michaelson ........... H05K 3/424
205/125
2007/0029675 A1* 2/2007 Barnett ................. H01L 23/585
257/E23.062
(Continued)

OTHER PUBLICATIONS

Yansheng Wang et al., "Grounding Structure Designs that Mitigate Undesired Resonances in High-Speed Signals", Technical Disclosure Commons Defensive Publications Series, Jun. 11, 2019, 11 pages.

*Primary Examiner* — Ishwarbhai B Patel
(74) *Attorney, Agent, or Firm* — Edell, Shapiro & Finnan, LLC

(57) ABSTRACT

A multilayer printed circuit board having a stackup including an upper half of the stackup and a lower half of the stackup, the multilayer printed circuit board having a top exposed surface and a bottom exposed surface, a first trace and via structure, having one portion disposed on the top exposed surface and another portion disposed within the upper half of the stackup, a second trace and via structure, having one portion disposed on the top exposed surface and another portion disposed within the upper half of the stackup, and first electrical components and second electrical components disposed on the top exposed surface of the multilayer printed circuit board and associated, respectively, with the first trace and via structure and the second trace and via structure, wherein the first electrical components are mounted orthogonally with respect to the second electrical components.

14 Claims, 19 Drawing Sheets

(51) Int. Cl.
*H05K 3/30* (2006.01)
*H05K 3/42* (2006.01)
(52) U.S. Cl.
CPC ......... *H05K 1/0219* (2013.01); *H05K 1/0231* (2013.01); *H05K 1/0245* (2013.01); *H05K 2201/10015* (2013.01)

(56) References Cited

U.S. PATENT DOCUMENTS

| | | | |
|---|---|---|---|
| 2008/0116981 A1* | 5/2008 | Jacobson | H05K 1/0243 331/74 |
| 2013/0025919 A1 | 1/2013 | Lau | |
| 2014/0182891 A1 | 7/2014 | Rengarajan et al. | |
| 2015/0348901 A1* | 12/2015 | Warwick | H01L 23/5286 257/774 |
| 2016/0183373 A1 | 6/2016 | Williams et al. | |
| 2018/0184515 A1 | 6/2018 | Anand et al. | |
| 2020/0375024 A1* | 11/2020 | Kim | H05K 3/4007 |

* cited by examiner

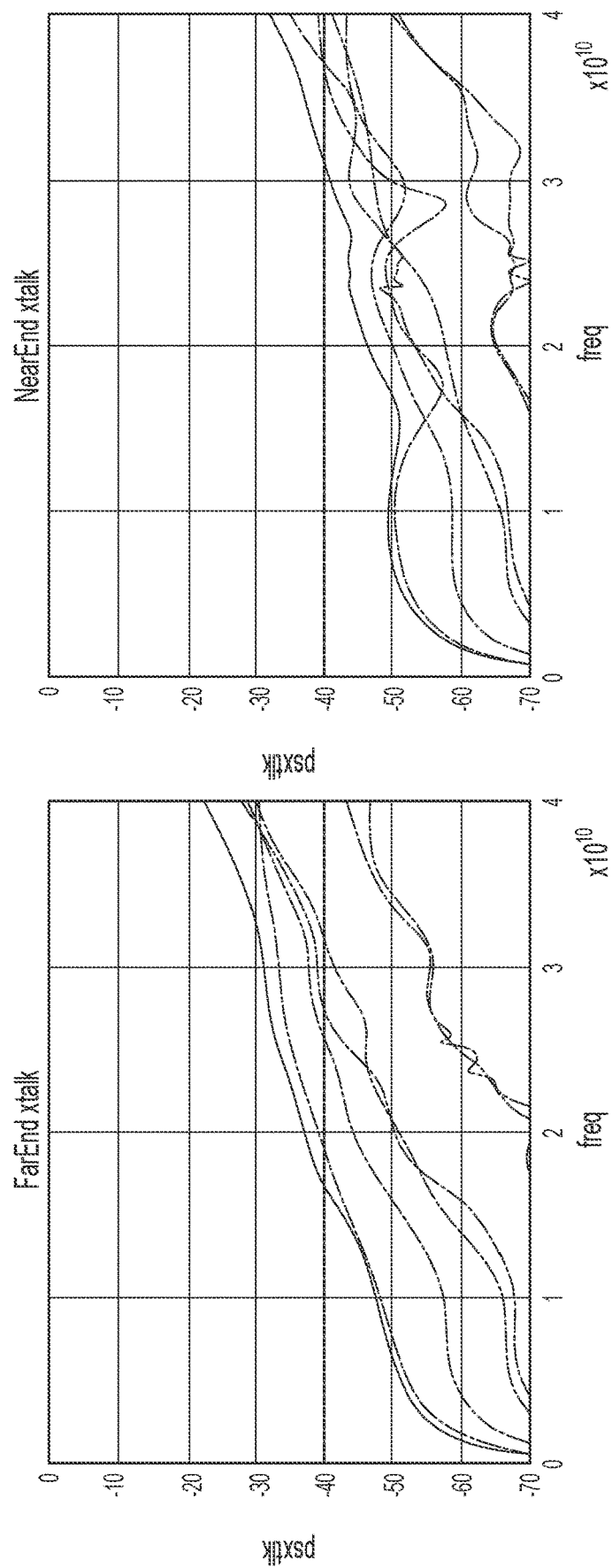

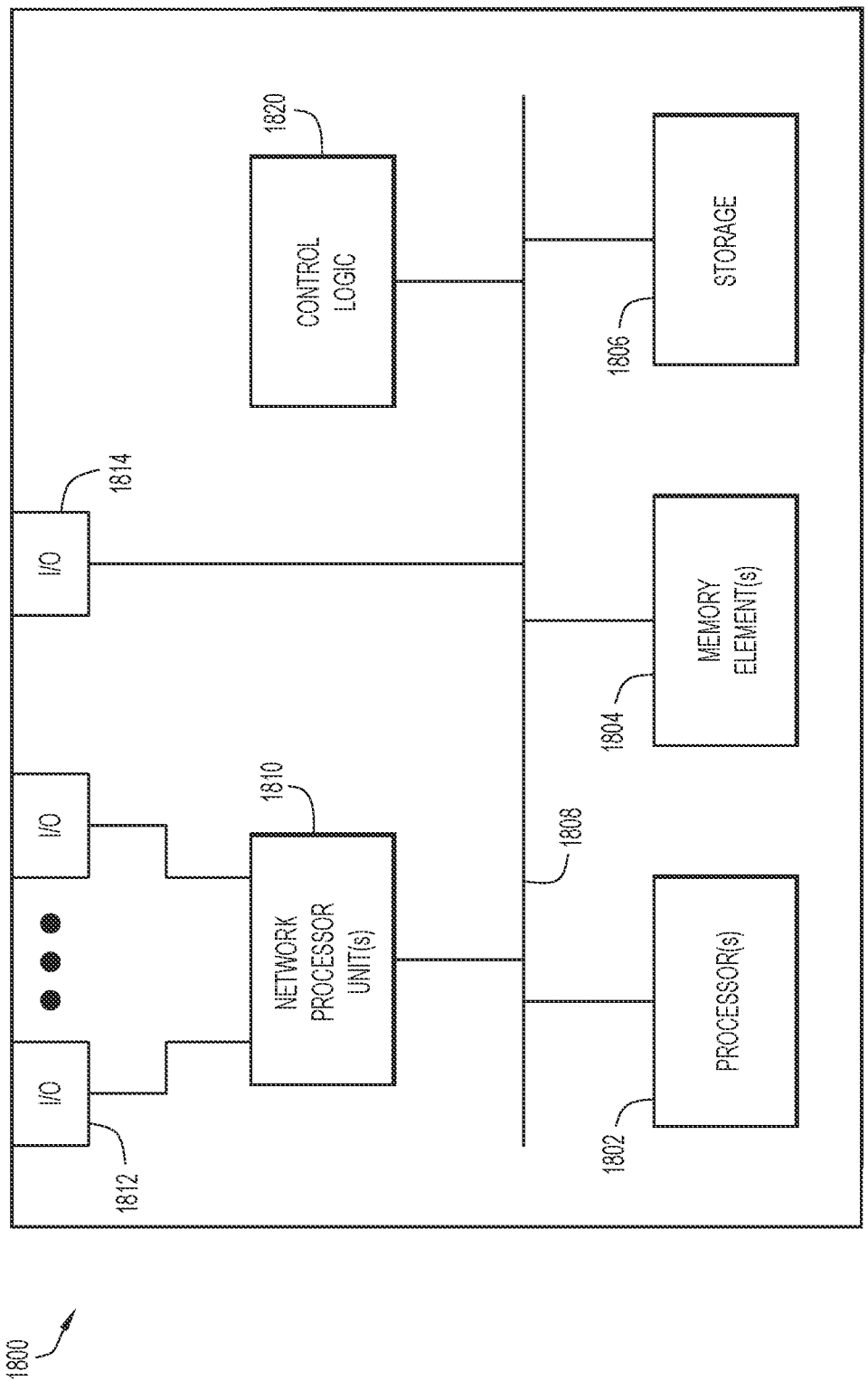

of FIG. 5, an array of blocks of intermingled differential vias

INTERLACED CROSSTALK CONTROLLED TRACES, VIAS, AND CAPACITORS

TECHNICAL FIELD

The present disclosure relates to multi-layer printed circuit board architecture and layout.

BACKGROUND

Computers are everywhere in today's society. They come in all different varieties and can be found in places such as automobiles, laptops or home personal computers, banks, personal digital assistants, cell phones, and servers. In addition, as computers become more commonplace and as software becomes more complex, there is a need for computing devices to process more data at faster speeds using a smaller package and less power. As such, the area of a printed circuit board (PCB) of a computing system utilized by the components and portions of a given computing system becomes a highly valuable commodity. In general, the less area of the PCB a computing system circuit uses, the smaller the computer system package may be. Alternatively, area not utilized by a computer system circuit may be used to enhance the circuit's performance through additional components of the circuit.

However, placing components or conductors of the PCB near each other may result in negative consequences in the performance of the circuit. For example, vias provide electrical connections between layers of a multi-layer PCB to carry signals or power between the layers and traces on those layers. As such, high frequency signals may be carried along the vias through the PCB from one layer to another, or along the traces on the same or different layers. Unfortunately, a signal transmitted along a via or trace may capacitively couple with/to another via or trace that is located nearby. This capacitive coupling appears as noise in the signals being transmitted along the vias and traces. Some coupling among vias and traces in the PCB may affect the performance of the circuit such that errors in the computing system occur. Indeed, the higher the frequency of the signals, the higher, typically, is undesirable capacitive (and/or inductive) coupling and resulting errors.

BRIEF DESCRIPTION OF THE DRAWINGS

FIGS. 9A and 9B are graphs showing, respectively, far end crosstalk and near end crosstalk, and power sum crosstalk for a third and fourth selected victim in the array of blocks of intermingled differential vias as shown in FIG. 4, according to an example embodiment.

FIG. 18 illustrates a hardware block diagram of a computing device, according to an example embodiment.

DESCRIPTION OF EXAMPLE EMBODIMENTS

Overview

Figure 1:
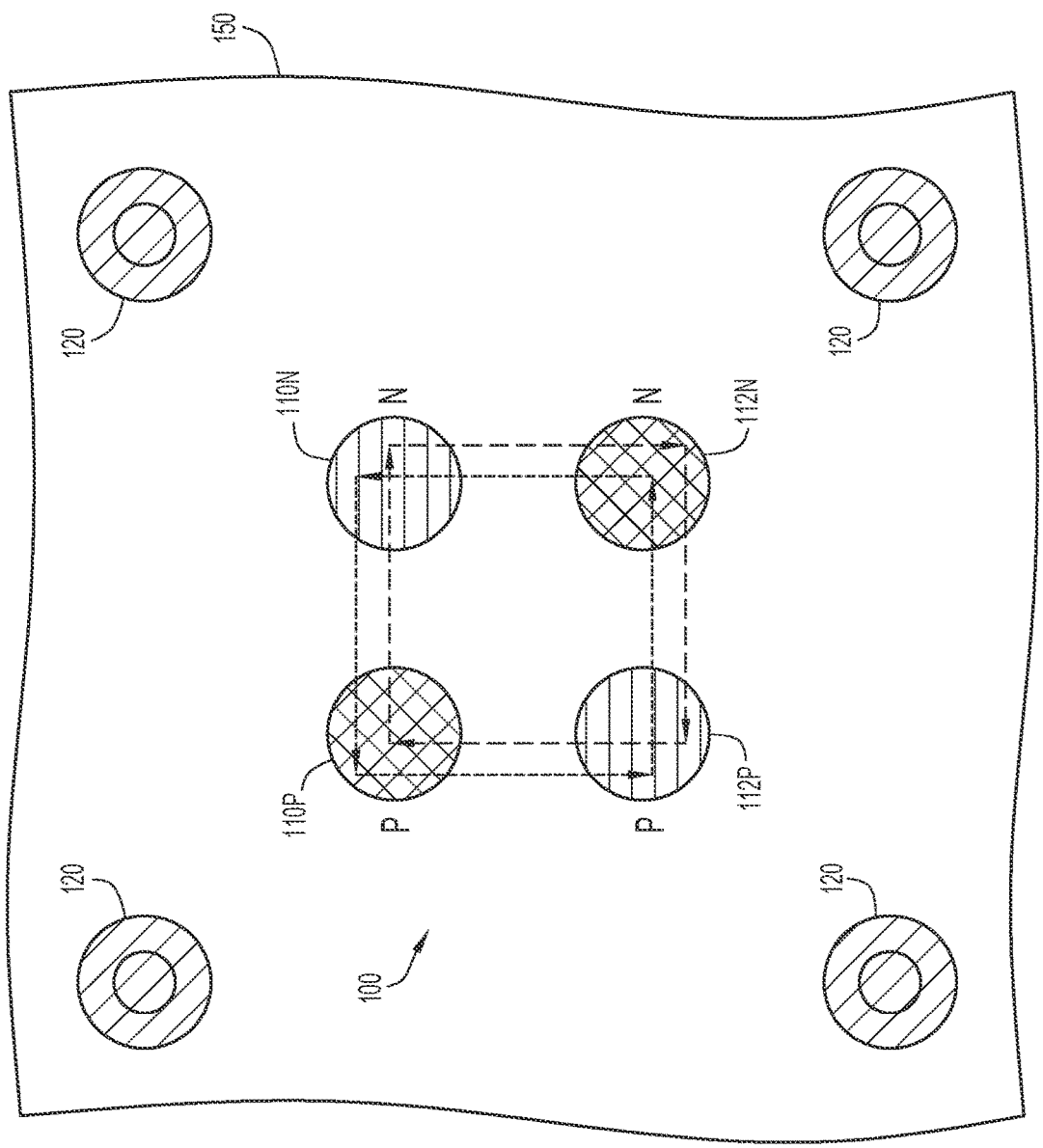
FIG. 1 shows a plan view of a block of two intermingled differential vias disposed in a printed circuit board (PCB), according to an example embodiment.

Presented herein is a multilayer printed circuit board having a stackup including an upper half of the stackup and a lower half of the stackup, the multilayer printed circuit board having a top exposed surface and a bottom exposed surface, a first trace and via structure, having one portion disposed on the top exposed surface and another portion disposed within the upper half of the stackup, a second trace and via structure, having one portion disposed on the top exposed surface and another portion disposed within the upper half of the stackup, and first electrical components and second electrical components disposed on the top exposed surface of the multilayer printed circuit board and associated, respectively, with the first trace and via structure and the second trace and via structure, wherein the first electrical components are mounted orthogonally with respect to the second electrical components.

In another embodiment, a method is provided that includes routing, on a first internal layer of a printed circuit board, a first pair of traces from a first trace and via structure between vias of a second trace and via structure, routing, on a second internal layer of the printed circuit board, a second pair of traces from the second trace and via structure between vias of the first trace and via structure, backdrilling the vias of the first trace and via structure to a first depth, and backdrilling the vias of the second trace and via structure to a second depth that is deeper than the first depth.

In still another embodiment, a multilayer printed circuit board is described and includes a stackup of layers including an upper half of the stackup and a lower half of the stackup, the multilayer printed circuit board having a top exposed surface and a bottom exposed surface, and further having an array of blocks of intermingled differential vias disposed in the multilayer printed circuit board.

Example Embodiments

Among computing or processing devices that employ a multi-layer printed circuit board (PCB) is a serializer/deserializer (SERDES), typically implemented as an integrated circuit that is mounted on the PCB. A SERDES is high speed communications device that converts data between serial data and parallel interfaces in each direction. The primary use of a SERDES is to provide data transmission over a single line or a differential pair in order to minimize the number of I/O pins and interconnects needed to communicate between computing devices that are spaced apart from one another.

Current and next generation SERDES rely on coupling capacitors to operate. Given the frequencies at which a SERDES functions, crosstalk between the vias, traces, and capacitors themselves (including their connection terminals) that serve the SERDES in/on the multi-layer PCB is an issue. The techniques described herein help to control (i.e., reduce) crosstalk among multi-layer PCB structures while at the same time optimizing use of PCB real-estate. That is, as will be described more fully below with reference to the drawings, described herein are techniques for arranging intermingled differential vias and providing an overall via and trace architecture for a multi-layer PCB that provides effective crosstalk reduction. Such techniques are useful in SERDES applications as well as other applications where multiple vias, traces, and electrical components are densely arranged in/on a multi-layer PCB.

FIG. 1 shows a plan view of a block 100 of two intermingled differential vias disposed in/on a printed circuit board (PCB) 150, according to an example embodiment. As shown, a first differential via pair comprising vias 110P (positive), 110N (negative) and a second differential via pair comprising vias 112P, 112N are arranged in a square pattern, e.g., with each via centered on a respective vertex of a square. In this configuration, the differential via pairs are electromagnetically balanced in that, e.g., via 110P is equidistant from via 112P and via. 112N. Likewise, via 110N is equidistant from vias 112P and 112N. As a result, any interference picked up by vias 112P, 112N as a result: of crosstalk from vias 110P, 110N will be cancelled due to the properties of differential signals, i.e the same interference is cancelled out when the signals of the differential pair are subtracted from one another, Also shown in FIG. 1 are ground vias 120. With such an arrangement, a ground, signal, signal, ground (GSSG) architecture is realized, In accordance with the embodiments described herein, the signal-to-ground (S:G) ratio may be up to 36:16.

Figure 2:
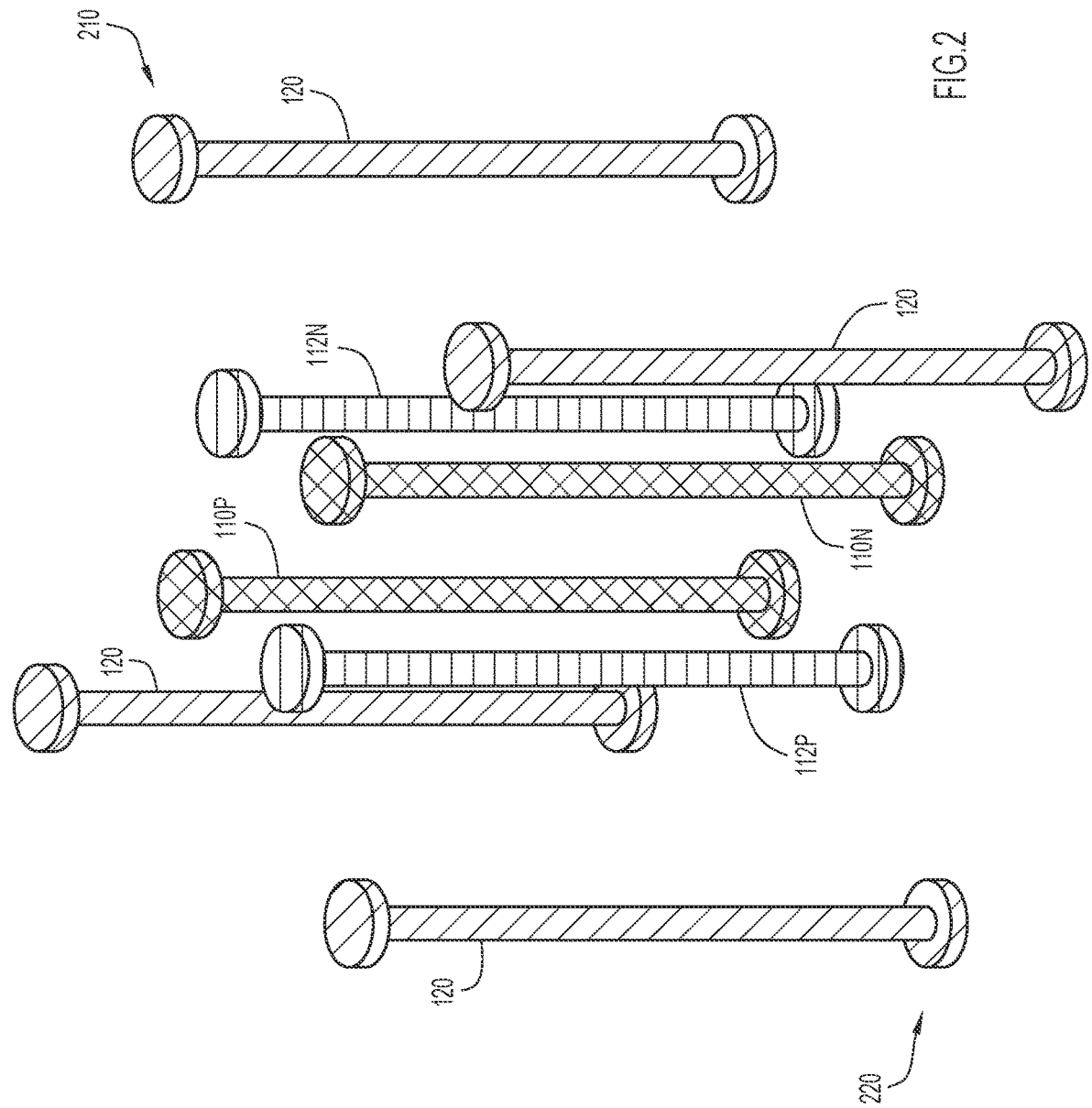
FIG. 2 shows a perspective view of the block of two intermingled differential vias of FIG. 1, according to an example embodiment.

FIG. 2 shows a perspective or 3D view of the block of two intermingled differential vias of FIG. 1, according to an example embodiment. In the embodiment shown, the vias 110P, 110N, 112P, 112N pass from a topmost layer to a bottom-most layer of the PCB (not shown). However, as will be described elsewhere, selected ones of those vias may be backdrilled from either the top 210 or the bottom 220 of the PCB. Such backdrilling further isolates signals from one another, thus still further reducing the amount of crosstalk between differential pairs in the block 100 of two intermingled differential vias.

Figure 3A:
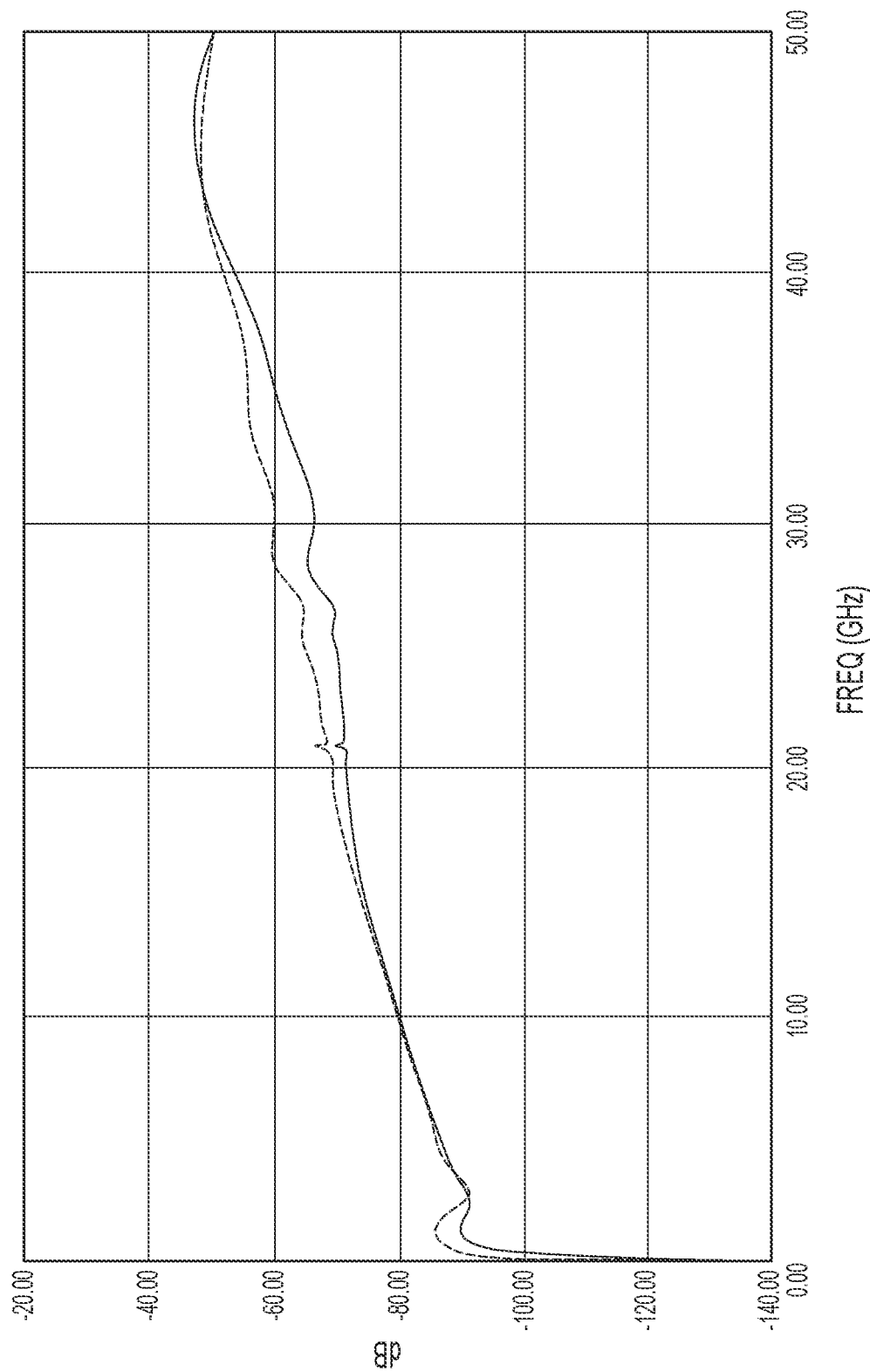
FIGS. 3A and 3B are graphs showing, respectively, far end crosstalk and near end crosstalk for the two intermingled differential vias of FIG. 1, according to an example embodiment.
Figure 3B:
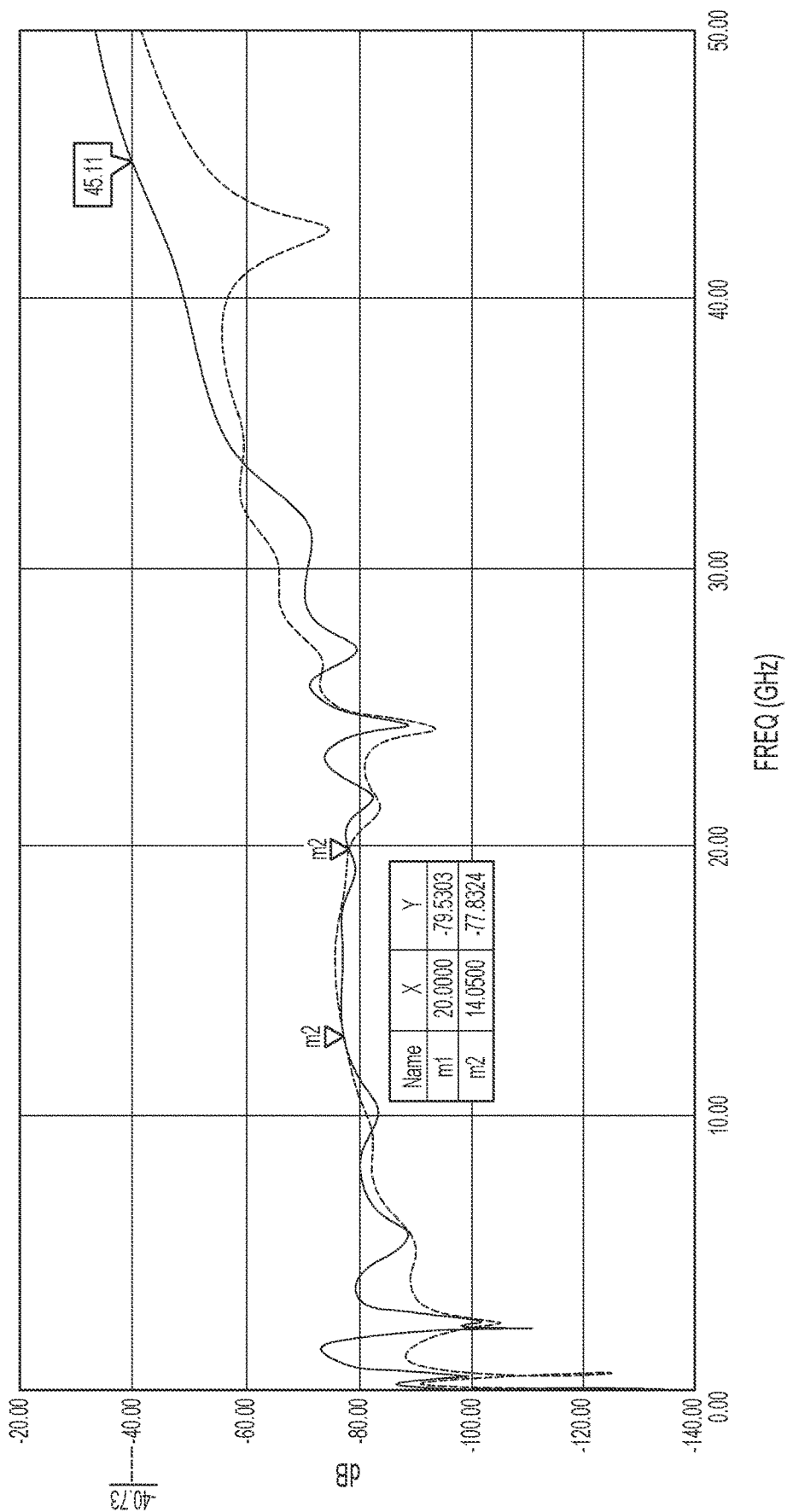

In the configuration shown in FIGS. 1 and 2, the electromagnetic interactions among P and N of both differential vias 110P, 110N, 112P. 112N are equal. Thus, it is expected that these two pairs have a minimal coupling. Simulation results for a top to bottom intermingled differential vias verifies this prediction, More specifically, FIGS. 3A and 3B are graphs showing, respectively, far end crosstalk (FEXT) and near end crosstalk (NEXT) for the two intermingled differential vias of FIG. 1, according to an example embodiment. As shown, FEXT and NEXT for this system is as low as −40 dB even for frequencies up to 45 GHz.

Figure 4:
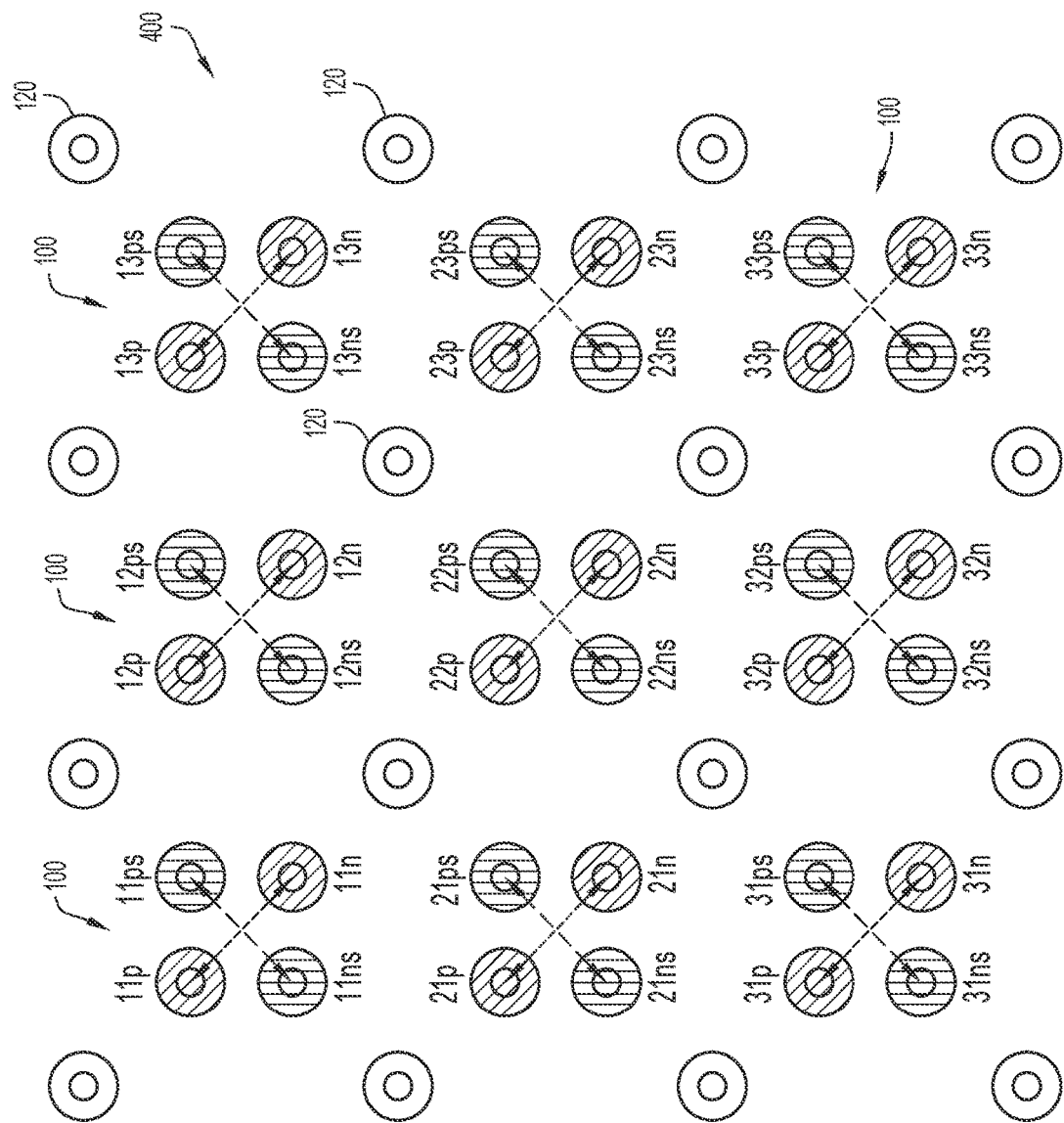
FIG. 4 shows an array of blocks of intermingled differential vias disposed on a PCB along with a naming convention to uniquely identify each individual via, according to an example embodiment.

FIG. 4 shows an array 400 of blocks 100 of intermingled differential vias disposed on a PCB along with a naming convention to uniquely identify each individual via, according to an example embodiment. As shown, each block 100 is arranged adjacent another block 100, in a checkerboard layout, where ground vias 120 are shared by adjacent blocks 100. Such an array 400 can be disposed on a PCB next to an integrated circuit, such as a SERDES. In one implementation, via-to-via spacing is 32 mil, and eighteen differential vias can be placed in a 288×288 mil square space on the PCB. The eighteen vias, in the depicted embodiment, are organized into nine blocks 100, with three rows and three columns. The top left block is in row 1 column 1, and thus the vias in that block are designated as 11p, 11n, 11ps (second), 11ns (second), The top right block 100 is in row 1, column 3, and thus the vias in that block are designated as 13p, 13n, 13ps (second), 13ns (second). The bottom right block 100 is in row 3, column 3, and thus the vias in that block are designated as 33p, 33n, 33ps (second), 33ns (second). The intervening blocks include 12p, 12n, 12ps, 12ns, 13p, 13n, 13ps, 13ns, 21p, 21n, 21ps, 21ns, 22n, 22ps, 22ns, 23p, 23n, 23ps, 23ns, 31p, 31n, 31ps, 31ns, 32p, 32n, 32ps, and 32ns. The signal-to-ground (S:G) ratio may thus be easily seen to be 36:16 in this embodiment.

In the arrangement of FIG. 4, adjacent blocks 100 are considered to be the main aggressors. Thus, in order to further reduce crosstalk among adjacent blocks 100, the PCB is configured to alternate the layer usage between a top half and a bottom half stackup in adjacent differential blocks. This arrangement is shown in FIGS. 5 and 6.

Figure 5:
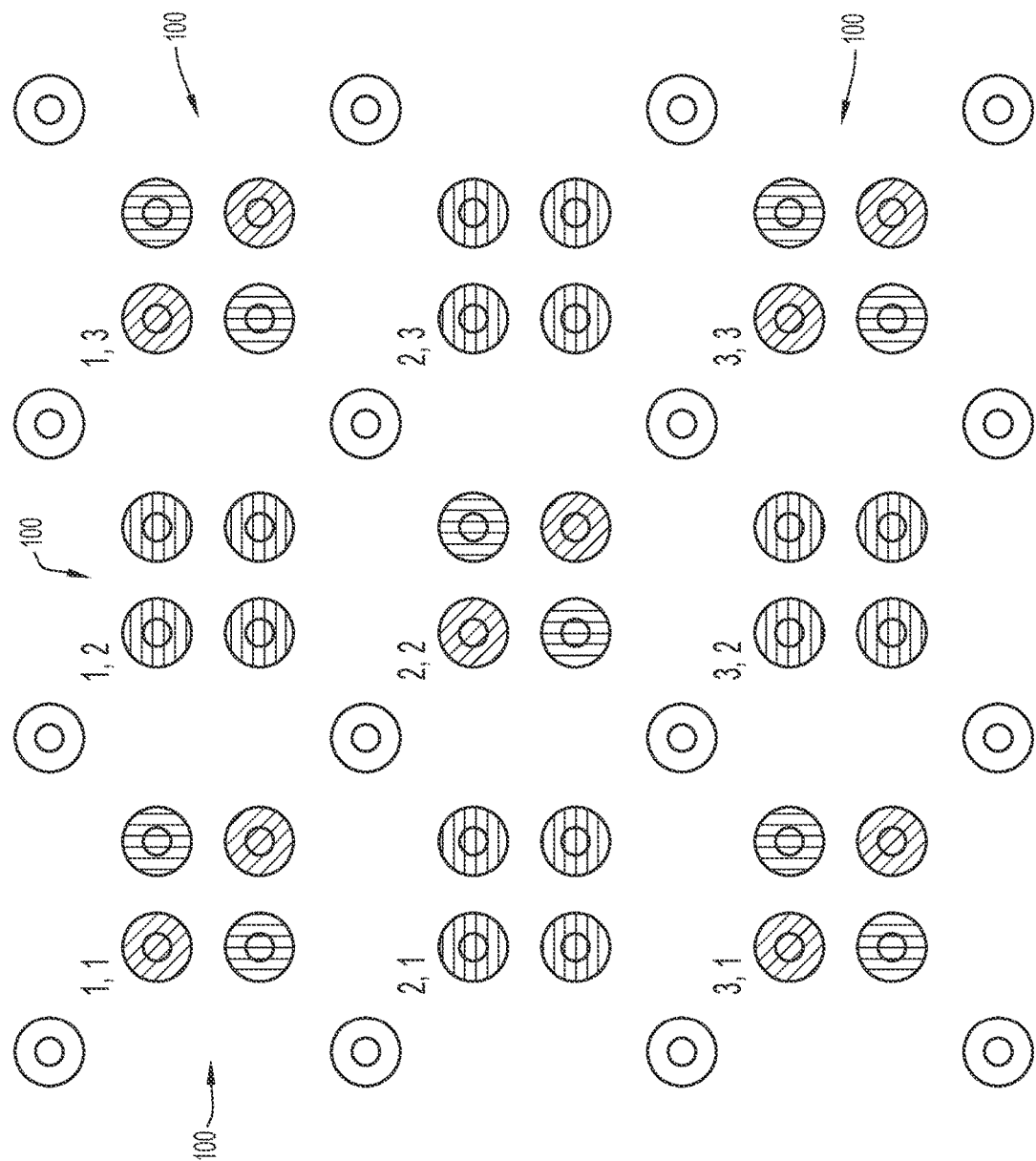
FIG. 5 shows, from a top side of a PCB, an array of blocks of intermingled differential vias disposed in the PCB with selected vias backdrilled, according to an example embodiment.

That is, FIG. 5 shows, from a top side of a PCB, an array 400 of blocks 100 of intermingled differential vias disposed in the PCB with selected vias backdrilled, according to an example embodiment. In this embodiment, the blocks 100 are designated generally by row, column, e.g., 1,1 for the top left block 100, and 3,3 for the bottom right block 100. In this case, the vias associated with blocks 100 1,2, 2,1, 2,3, and 3,2 are backdrilled from the top such that the closest aggressor block 100 is arranged diagonally from a given victim block 100.

Figure 6:
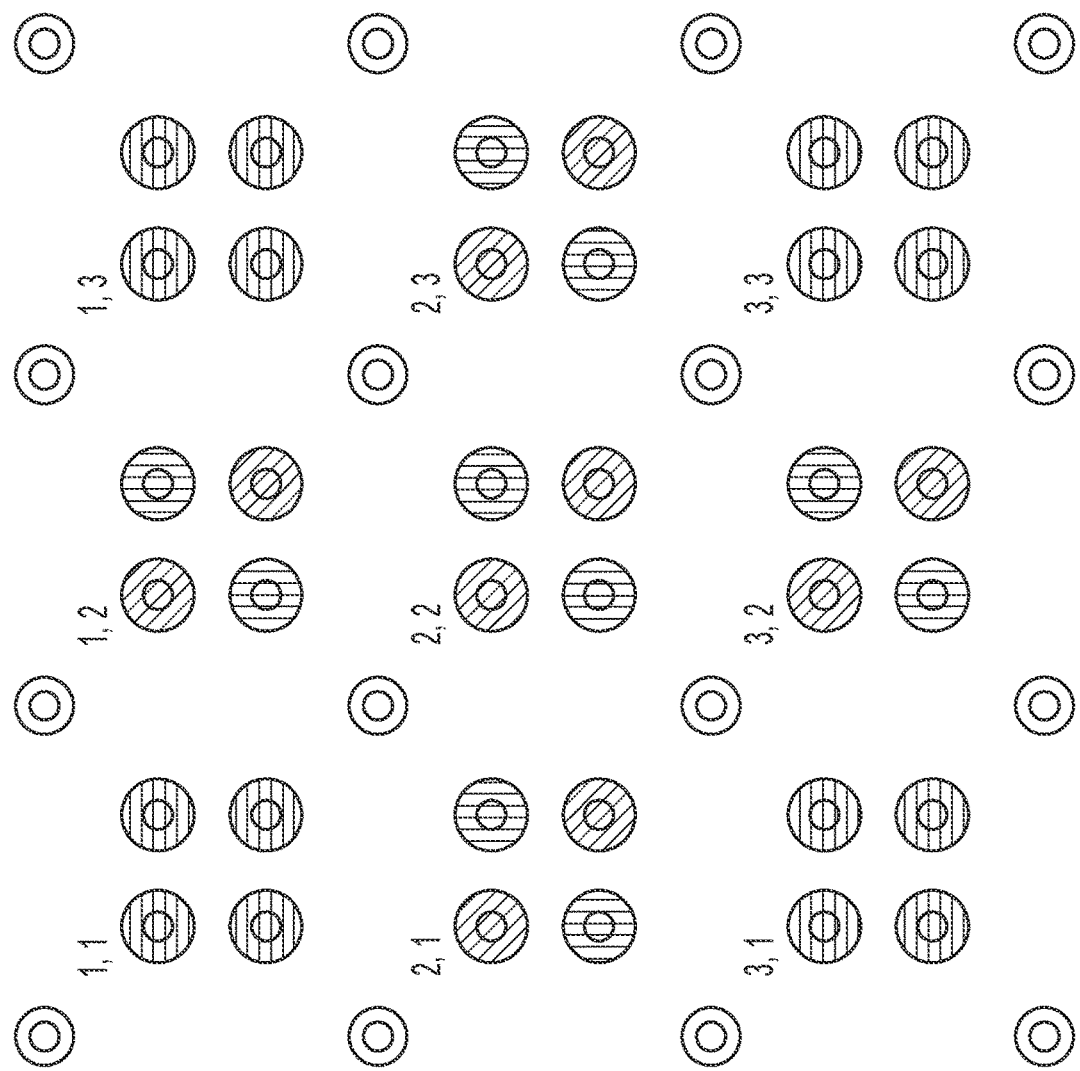
FIG. 6 shows, from a bottom (opposite) side of the PCB of FIG. 5, an array of blocks of intermingled differential vias disposed in the PCB with selected alternate vias backdrilled, according to an example embodiment.

FIG. 6 shows, from a bottom (opposite) side of the PCB of FIG. 5, an array 400 of blocks 100 of intermingled differential vias disposed in the PCB with selected alternate vias backdrilled, according to an example embodiment. That is, from a bottom view of the PCB, and, e.g., directly underneath the pattern shown in FIG. 5, blocks 100 1,1, 1,3, 2,2, 3,1, and 3,3 are backdrilled. In this, away, differential vias are separated not only in a planar dimension, but also by a depth dimension.

Due to symmetry, only three measures of powersum crosstalk are needed to analyze the backdrilled arrangement of FIGS. 5 and 6: a) diff (2,2) (with worst case crosstalk), b) diff (1,1), and c) diff (1,2).

Figure 7B:
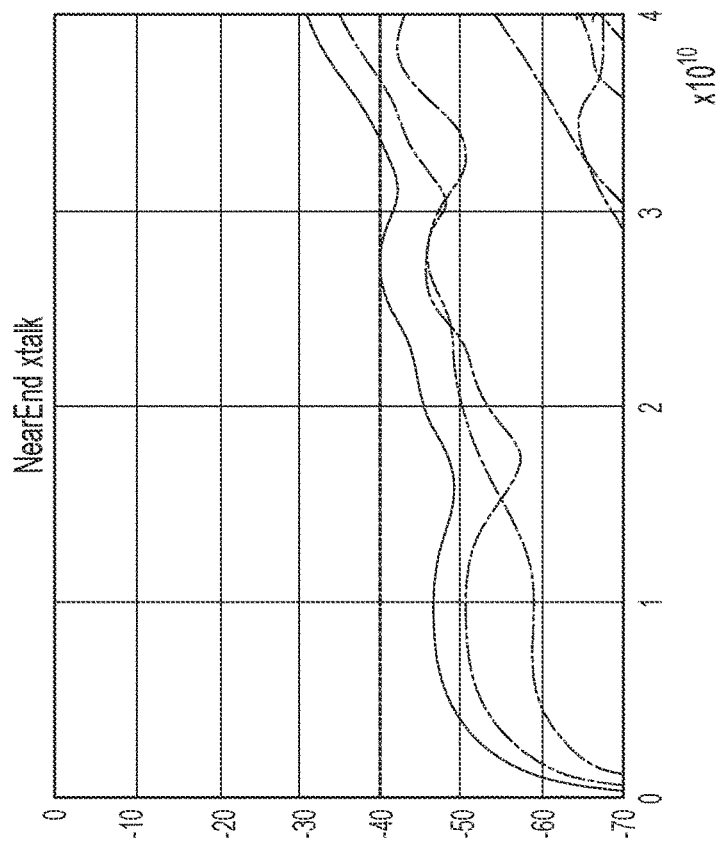
FIGS. 7A and 7B are graphs showing, respectively, far end crosstalk and near end crosstalk, and power sum crosstalk for a first selected victim in the array of blocks of intermingled differential vias as shown in FIG. 4, according to an example embodiment.
Figure 7A:
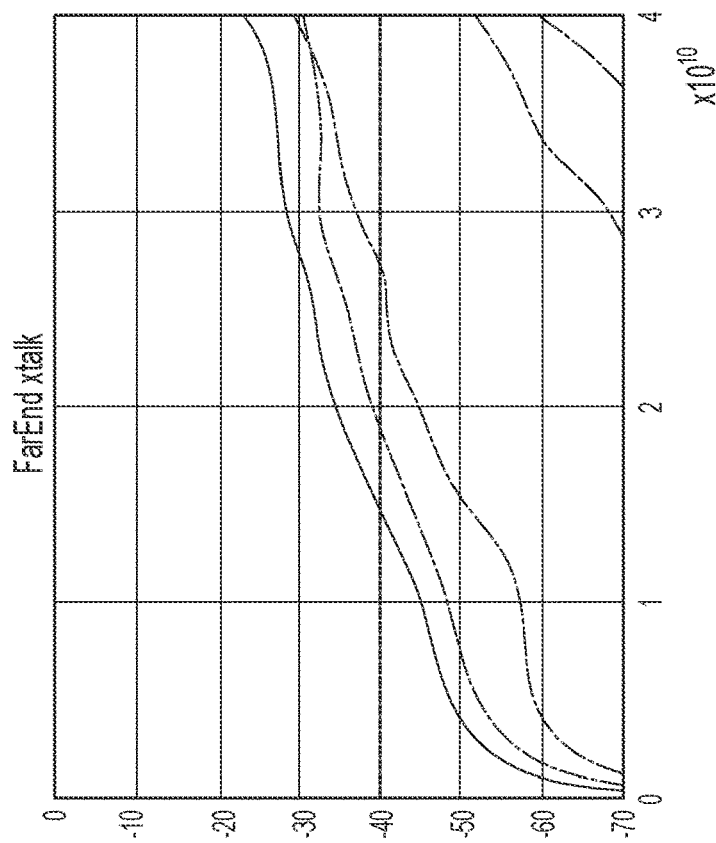

FIGS. 7A and 7B are graphs showing, respectively, far end crosstalk and near end crosstalk (and powersum crosstalk) for a first selected victim, i.e., 2,2, in the array 400 of blocks 100 of intermingled differential vias as shown in FIG. 4, according to an example embodiment.

Figure 8B:
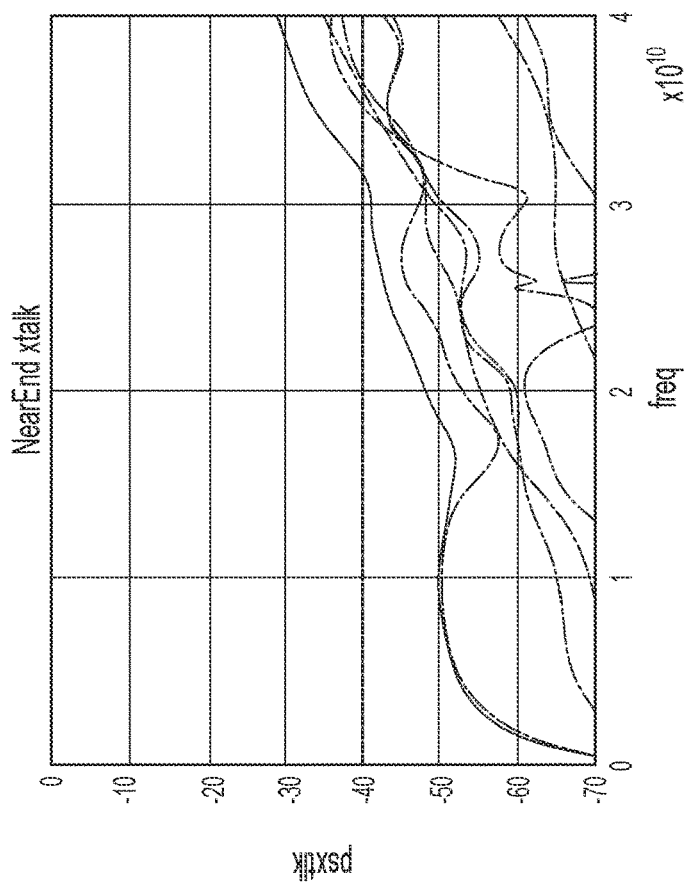
FIGS. 8A and 8B are graphs showing, respectively, far end crosstalk and near end crosstalk, and power sum crosstalk for a second selected victim in the array of blocks of intermingled differential vias as shown in FIG. 4, according to an example embodiment.
Figure 8A:
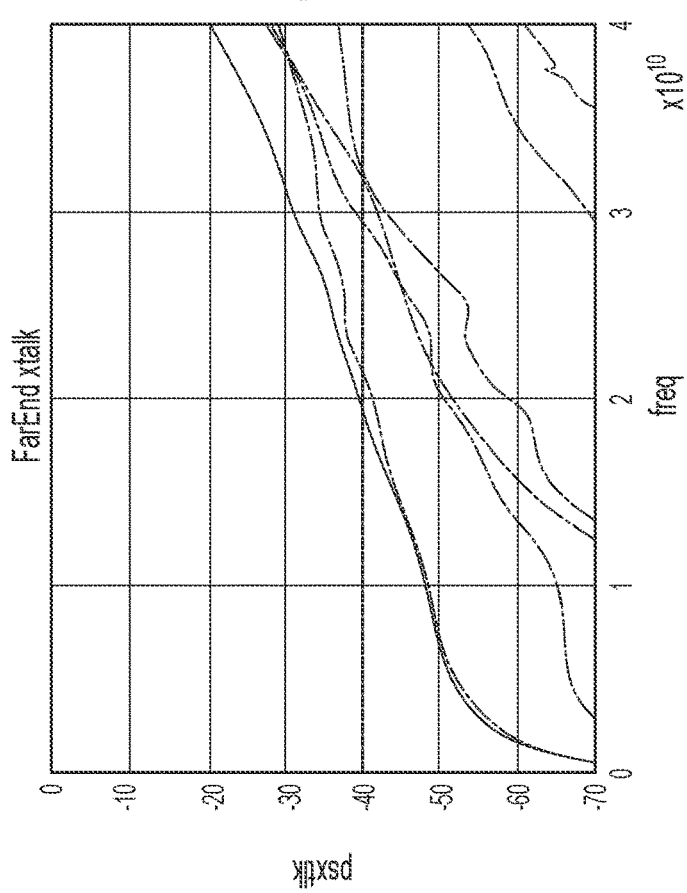

FIGS. 8A and 8B are graphs showing, respectively, far end crosstalk and near end crosstalk (and powersum crosstalk) for a second selected victim, i.e., 1,1, in the array 400 of blocks 100 of intermingled differential vias as shown in FIG. 4, according to an example embodiment.

FIGS. 9A and 9B are graphs showing, respectively, far end crosstalk and near end crosstalk (and powersum crosstalk) for a third and fourth selected victim, i.e., 1,2 and 2,1, in the array 400 of blocks 100 of intermingled differential vias as shown in FIG. 4, according to an example embodiment.

The simulation resulting in the graphs of FIGS. 7A, 7B, 8A, 8B, 9A, and 9B was conducted on a half stackup height of 68 mils. In an actual implementation, the crosstalk may be even less than what is shown in FIGS. 7A, 7B, 8A, 8B, 9A, and 9B because the heights of the vias may be shorter.

Figure 10:
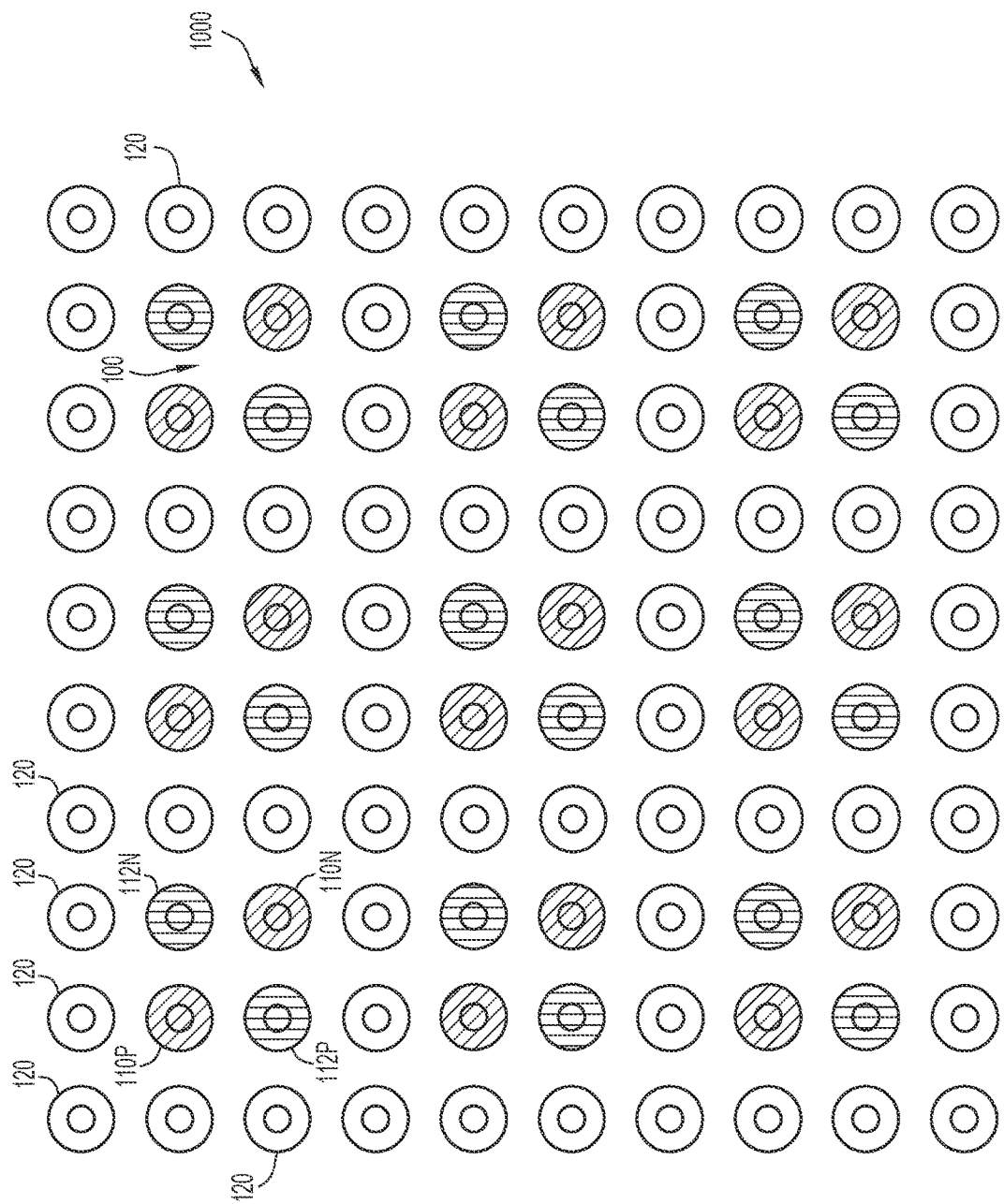
FIG. 10 shows another array of blocks of intermingled differential vias disposed in a PCB along with additional ground vias to further increase isolation among the intermingled differential vias, according to an example embodiment.

FIG. 10 shows another array 1000 of blocks of intermingled differential vias disposed in a PCB along with additional ground vias to further increase isolation among the intermingled differential vias, according to an example embodiment. That is, in FIG. 10 ground vias 120 fully surround each block 100 of intermingled differential vias. While this approach decreases the S:G ratio, additional isolation can be achieved.

Figure 11:
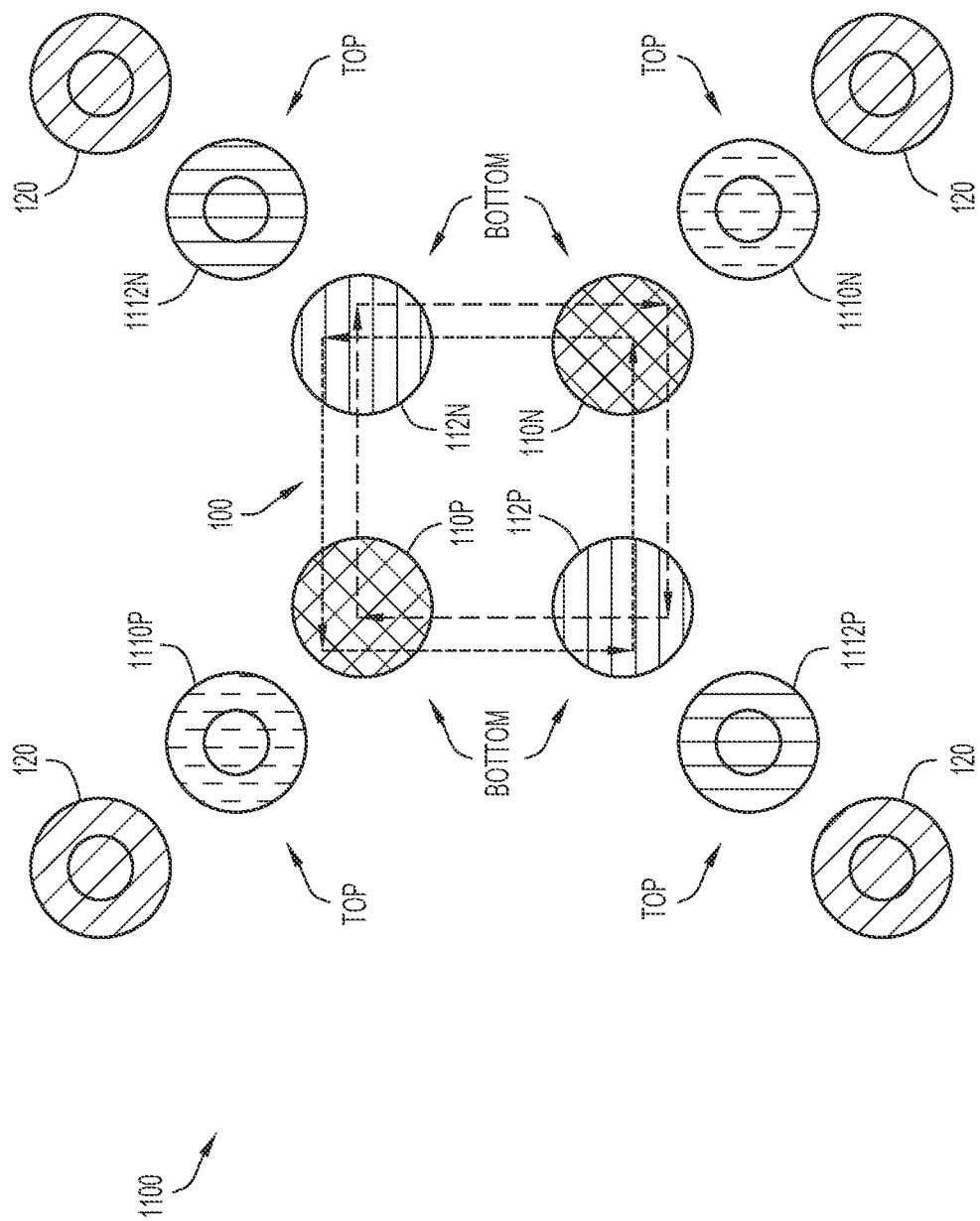
FIG. 11 shows still another possible arrangement of blocks of intermingled differential vias disposed in a printed circuit board (PCB), according to an example embodiment.

FIGS. 11 shows still another possible arrangement of a block 1100 of intermingled differential vias disposed in a printed circuit board (PCB), according to an example embodiment. In this approach, two additional pairs of intermingled differential vias 1110P, 1110N, 1112P, 1112N are disposed symmetrically around block 100 of intermingled differential vias 110P, 110N, 112P, 112N. And, with the use of appropriate backdrilling, selected ones of these vias may be disposed only in a top half of a PCB stackup, while the remaining ones of these vias may be disposed only in a bottom half of the PCB stackup. Due to the symmetrical layout, the same advantages associated with reduced crosstalk are achieved.

Thus, those skilled in the art will appreciate that a density optimized array of transition vias is disclosed. With such a layout, 18 additional via pairs or 36 total differential vias (72 vias in total) can be placed on a PCB in a 480×480 mil square space. The ratio of signal-to-ground via usage is as high as 72:16, resulting in a compact design, and with fewer holes on power layers. The powersum crosstalk for this case is also extremely low.

In addition to the blocks 100, 1100 of intermingled differential vias described above, also described herein is an Interlaced Crosstalk Controlled (ICC) capacitor layout design. As will be evident to those skilled in the art, the disclosed ICC capacitor layout design leverages blocks of eight capacitors (i.e., four differential pair channels) co-located on the top and bottom of a PCB in a same predetermined area. Several factors are considered in connection with this layout design: a) minimum allowed spacing based on predetermined fabrication rules, b) routing (and power) friendly breakout into a ball grid array (BGA) pin field for, e.g., a SERDES device, c) optimized insertion loss by using solid ground references (GSSG), and d) achieving low crosstalk using various approaches discussed below.

In order to crosstalk isolate channels on opposite sides of a multilayer PCB stackup (i.e., isolate channels with capacitors on a top layer from channels with capacitors on a bottom layer), the embodiments described herein use a "layer utilization strategy." Capacitors placed on the top (exposed) side of the PCB use the upper half of the stackup for routing, and capacitors placed on the bottom (exposed) side of the PCB use the bottom half of the stackup for routing. By backdrilling and top drilling (i.e. backdrilling from a top side of the PCB) selected vias, the signals on the topside are effectively isolated from those on the bottom side, thus reducing crosstalk, where crosstalk coupling may be <~−80 dB.

Figure 12:
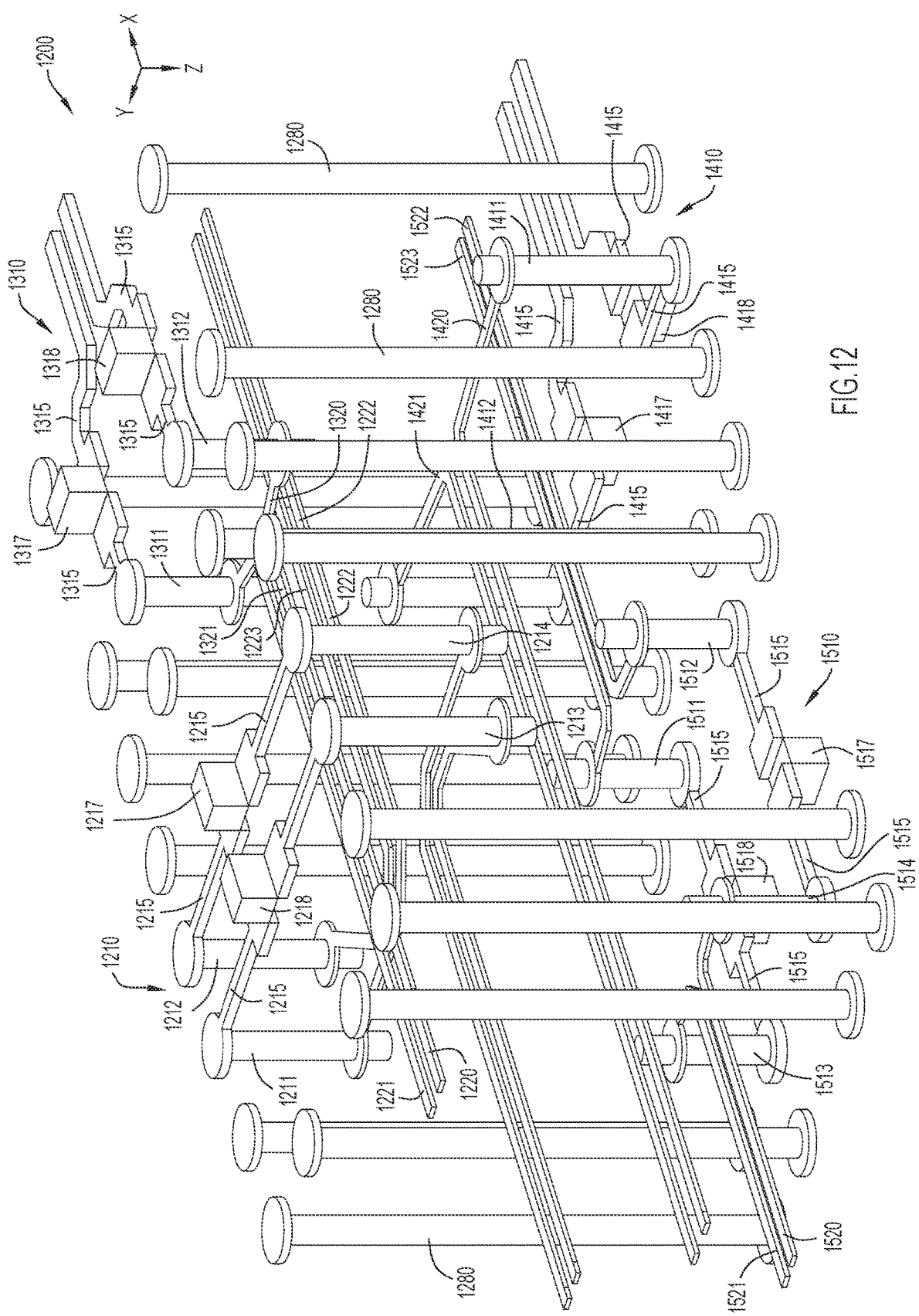
FIG. 12 shows a via and trace architecture for a multilayer PCB that provides an interlaced crosstalk controlled capacitor layout, according to an example embodiment.
Figure 13:
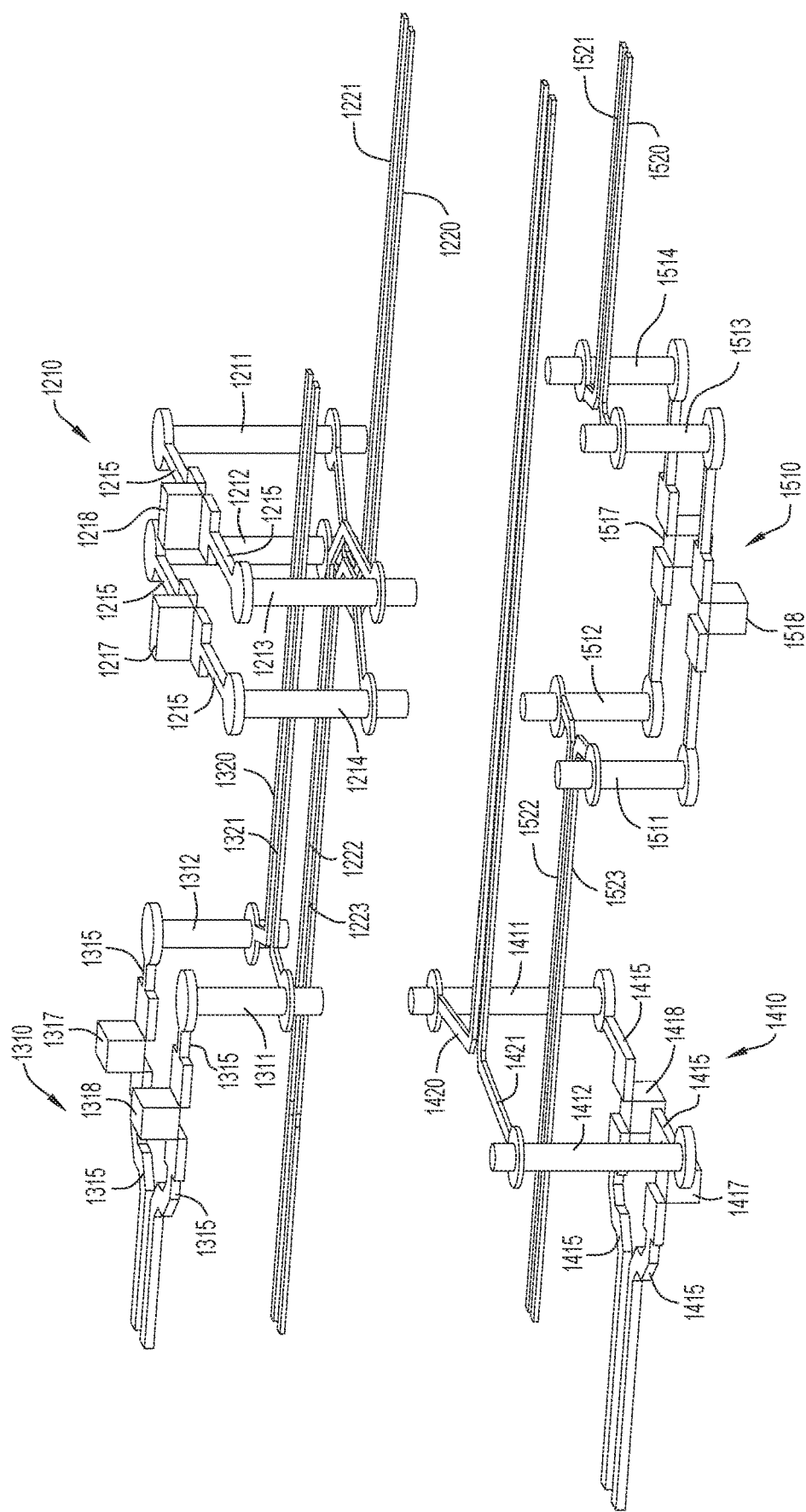
FIG. 13 illustrates more clearly the narrow and wide via stances for the via and trace architecture of FIG. 12, according to an example embodiment.
Figure 14B:
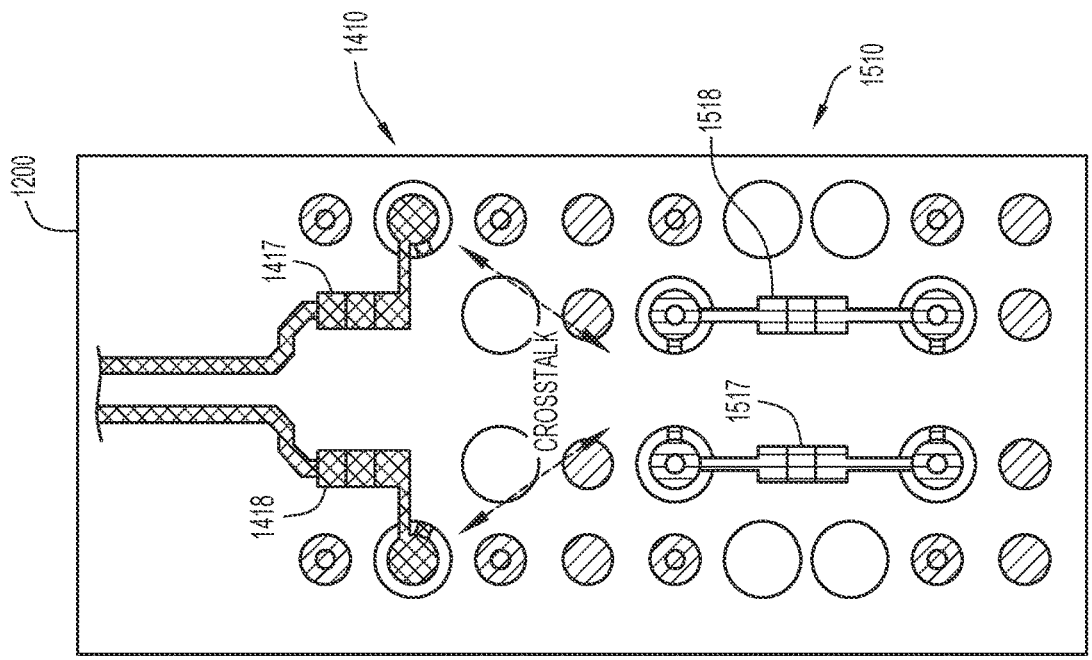
FIGS. 14A and 14B are, respectively, top and bottom plan views of orthogonal capacitor placement on the multi-layer PCB for the interlaced crosstalk controlled capacitor layout design, according to an example embodiment.
Figure 14A:
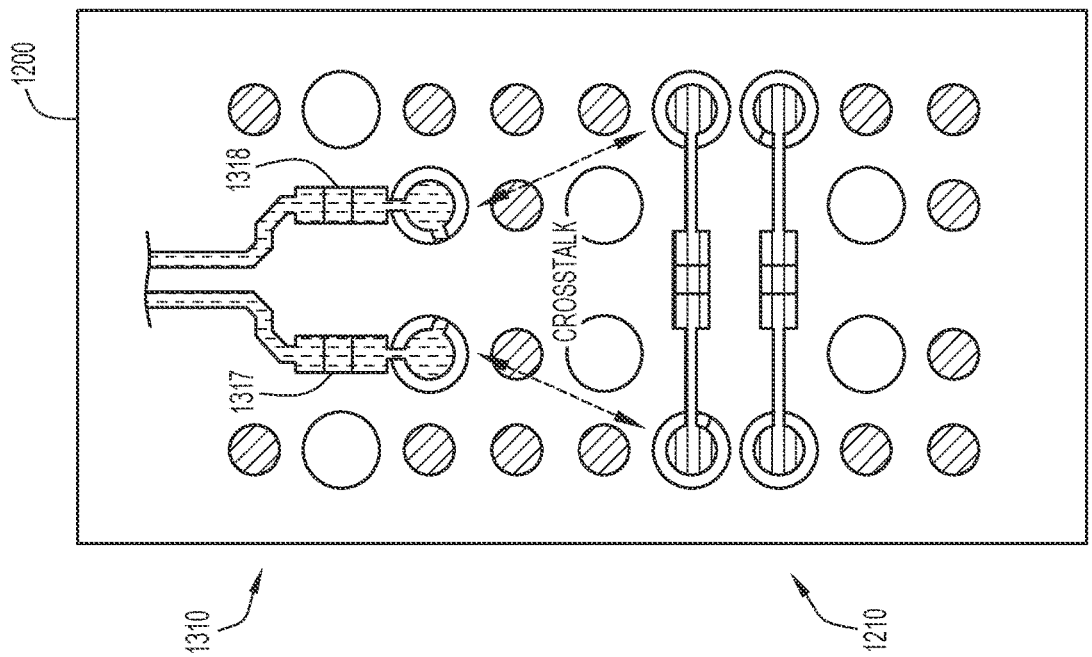

FIG. 12 shows a via and trace architecture for a multi-layer PCB 1200 that provides an ICC capacitor layout design, according to an example embodiment. As can be seen, several strategies are employed to crosstalk-isolate channels for capacitors on a same side of the PCB 1200 (within a same block of capacitors). Capacitors on the top side of the PCB are crosstalk-isolated by using geometrical orthogonality in placement of differential vias (FIG. 12). FIG. 13 shows another view of the overall ICC capacitor layout design, without ground vias, and a 180 degree rotation compared to FIG. 12. Capacitors on the bottom side of the PCB 1200 are crosstalk isolated by using predetermined separation (FIGS. 14A and 14B).

More specifically, FIG. 12 shows four different via and trace structures, including first structure 1210, second structure 1310, third structure 1410, and fourth structure 1510. First structure 1210 includes vias 1211, 1212, 1213, 1214, which are arranged to be electrically connected to traces 1215, on a top side of a PCB 1200, that are configured to terminate in pads on which capacitors 1217, 1218 are mounted (i.e., soldered to the PCB 1200). Internal layers of the PCB 1200 include traces 1220, 1221, 1222, 1223 that are electrically connected to vias 1211, 1212, 1213, 1214, as shown. Traces 1215 of first structure 1210 extend substantially along a Y-axis of PCB 1200 such that capacitors 1217, 1218 are oriented along the Y-axis when mounted. Also, as can be seen, the vias 1211, 1212, 1213, 1214 of first structure 1210 are arranged with a relative wide stance in the Y-axis direction, allowing other traces to more easily be routed between vias 1211, 1212, 1213, 1214.

Second structure 1310 includes vias 1311, 1312, which are arranged to be electrically connected to traces 1315, on a top side of a PCB 1200, that are configured to end in pads on which capacitors 1317, 1318 are mounted (i.e., soldered to the PCB 1200). Internal layers of the PCB 1200 include traces 1320, 1321 that are electrically connected to vias 1311, 1312, as shown. Traces 1315 of second structure 1310 extend substantially along the X-axis such that capacitors 1317, 1318 are oriented along the X-axis when mounted. Also, as can be seen, the vias 1311, 1312 of second structure 1310 are arranged with a relatively narrow stance in the Y-axis direction.

Third structure 1410 includes vias 1411, 1412, which are arranged to be electrically connected to traces 1415, on a bottom side of PCB 1200, that are configured to end in pads on which capacitors 1417, 1418 are mounted (i.e., soldered to PCB 1200). Internal layers of PCB 1200 include traces 1420, 1421 that are electrically connected to vias 1411, 1412, as shown. Traces 1415 of third structure 1410 are arranged such that capacitors 1417, 1418 are oriented along the X-axis when mounted. Also, as can be seen, the vias 1411, 1412 of third structure 1410 are arranged with a relatively wide stance in the Y-axis direction, allowing other traces to more easily be routed between vias 1411, 1412.

Fourth structure 1510 includes vias 1511, 1512, 1513, 1514, which are arranged to be electrically connected to traces 1515, on a bottom side of a PCB 1200, that are configured to terminate in pads on which capacitors 1517, 1518 are mounted (i.e., soldered to PCB 1200). Internal layers of the PCB 1200 include traces 1520, 1521, 1522, 1523 that are electrically connected to vias 1511, 1512, 1513, 1514, as shown. Traces 1515 of fourth structure 1510 extend substantially along the X-axis of PCB 1200 such that capacitors 1517, 1518 are oriented along the X-axis when mounted. Also, as can be seen, the vias 1511, 1512, 1513, 1514 of fourth structure 1510 are arranged with a relative wide stance in the X-axis direction.

As can be seen in FIG. 12 (and FIG. 13) the vias are truncated, i.e., backdrilled at least halfway into the stackup of the PCB 1200, from the top or bottom, as the case may be. Indeed, different pairs of vias may be backdrilled to different depths compared to other pairs of vias. For example, vias 1211, 1212, 1213, 1214 are all backdrilled to the same depth, whereas vias 1311, 1312 are backdrilled closer to a top exposed surface of the PCB 1200. Also, ground vias 1280 are provided throughout the layout design of the PCB 1200 to ensure a GSSG configuration.

In an embodiment, aggressor traces such as traces 1522, 1523 associated with fourth structure 1510 are routed through the wide stance of victim vias, e.g., vias 1411, 1412 of third structure 1410 where the trace-to-via spacing is more significant.

Also, aggressor traces, such as traces 1420, 1421 are routed at backdrilled region of the narrow stance of a victim channel handled by fourth structure 1510. That is, vias 1511, 1512, 1513, 1514 are backdrilled to below a level of traces 1420, 1421. As such, there is little to no via-to-trace crosstalk for closely spaced via to trace cases.

FIG. 13 illustrates more clearly the narrow and wide via stances for the via and trace architecture of FIG. 12. Note that ground vias 1280 are not shown in FIG. 13. Further, the first structure 1210, second structure 1310, third structure 1410, and fourth structure 1510 are together rotated by 180 degrees compared to the view shown in FIG. 12.

FIGS. 14A and 14B are, respectively, top and bottom plan views of orthogonal capacitor placement on the multilayer PCB for the interlaced crosstalk controlled capacitor layout design, according to an example embodiment, As shown, on a top side of PCB 1200 capacitors 1217, 1218 are oriented orthogonally with respect to capacitors 1317, 1318. Similarly, on a bottom side of PCB 1200, capacitors 1417, 1418 are oriented orthogonally with respect to capacitors 1517, 1518.

Those skilled in the art will appreciate that the via and trace architecture described herein is routing friendly in the vertical direction as shown in FIGS. 14A and 14B. This is accomplished by differential pairs being narrow enough to fit in between capacitor vias.

Figure 15:
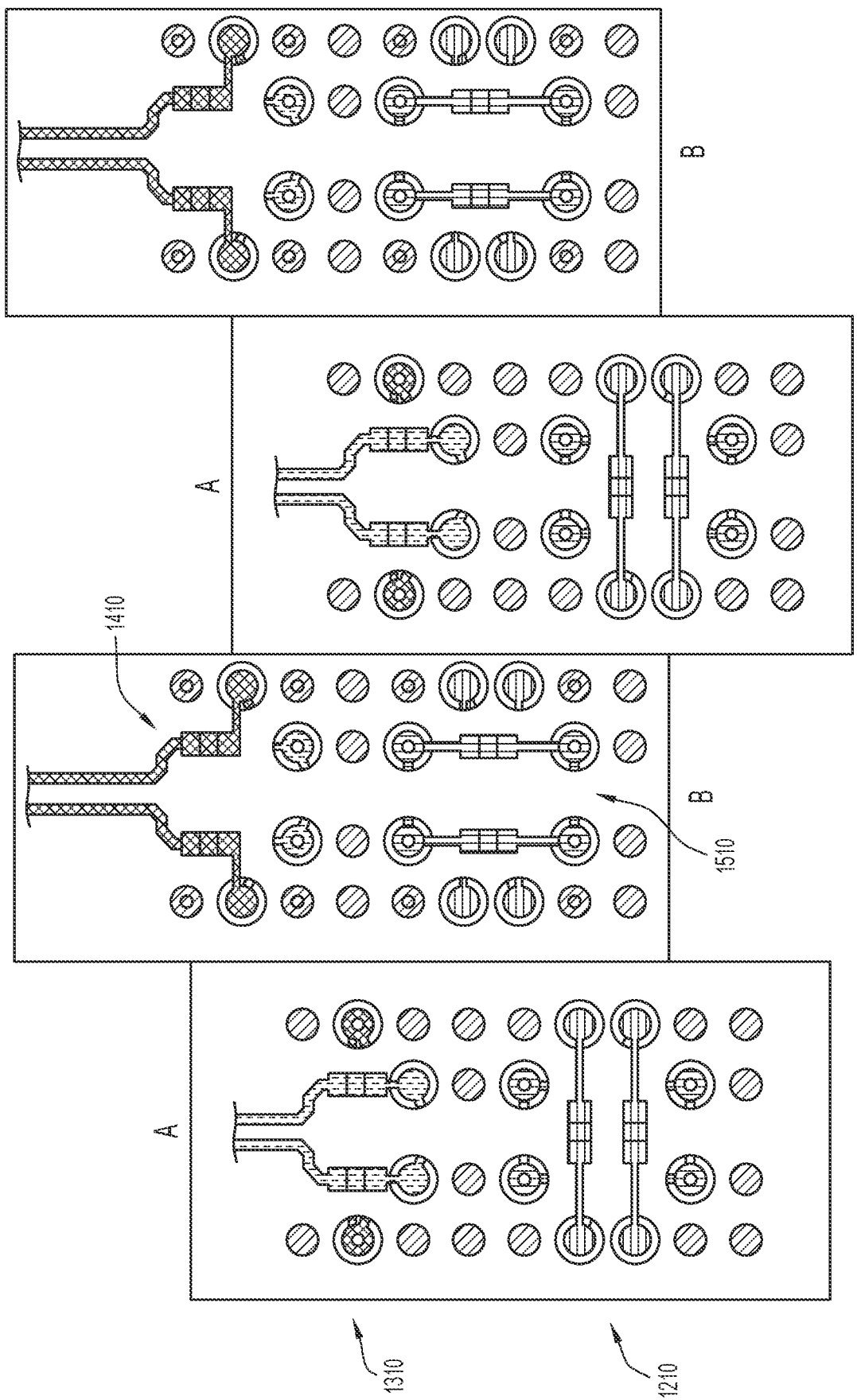
FIG. 15 shows alternating and offsetting blocks of the via and trace architecture, according to an example embodiment.

FIG. 15 shows alternating and offsetting blocks of the via and trace architecture, according to an example embodiment. That is, when placing several via and trace structures beside each other, it may be advantageous to alternate from top to bottom first structure 1210, second structure1310, third structure1410, fourth structure 1510 as well as offsetting those structures, resulting in a pattern ABABAB as shown in FIG. 15. This approach reproduces the desirable geometric orthogonality that helps to reduce crosstalk. Also, the illustrated arrangement helps to leverage the top and bottom layer of the stackup of the PCB 1200 to breakout to the first row of capacitors with no vias.

Figure 16:
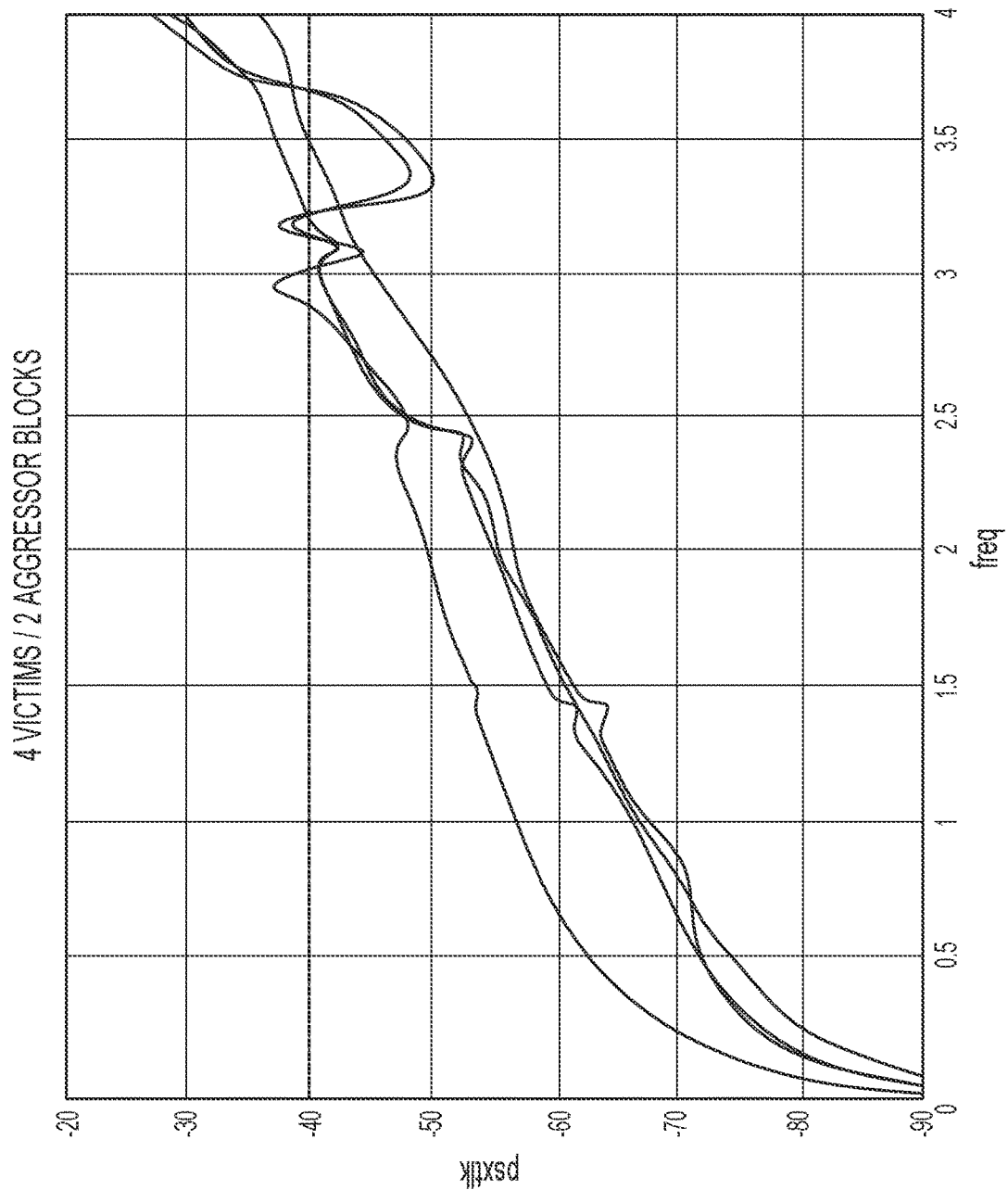
FIG. 16 is a graph showing powersum crosstalk at four victim blocks from two aggressor blocks, according to an example embodiment.

FIG. 16 is a graph showing powersum crosstalk at four victim blocks from two aggressor blocks, according to an example embodiment. As is evident from the figure, the achieved powersum crosstalk is −40 dB up to 29 GHz, with 8 aggressor channels for each victim).

Although not expressly shown, PCB 1200 may also incorporate the blocks of two intermingled differential vias described in connection with FIGS. 1-11.

Figure 17:
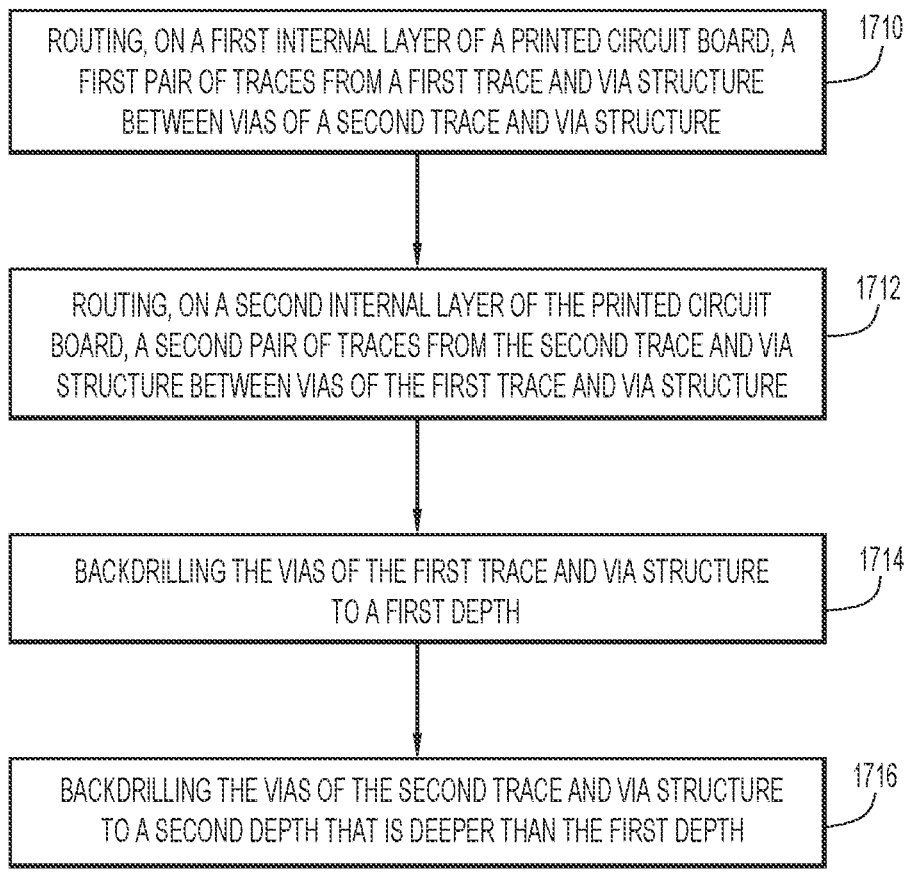
FIG. 17 is a flowchart showing a series of operations for routing traces in a multilayer printed circuit board, according to an example embodiment.

FIG. 17 is a flowchart showing a series of operations 1700 for routing traces in a multilayer printed circuit board, according to an example embodiment. At 1710, an operation includes routing, on a first internal layer of a printed circuit board, a first pair of traces from a first trace and via structure between vias of a second trace and via structure. At 1712, an operation routing, on a second internal layer of the printed circuit board, a second pair of traces from the second trace and via structure between vias of the first trace and via structure. At 1714. an operation includes backdrilling the vias of the first trace and via structure to a first depth. And, at 1716, an operation includes backdrilling the vias of the second trace and via structure to a second depth that is deeper than the first depth.

FIG. 18 illustrates a hardware block diagram of a computing device 1800 that may be employed to design the multilayer printed circuit board described herein, or that might incorporate the multilayer PCB described herein.

In at least one embodiment, the computing device 1800 may include one or more processor(s) 1802, one or more memory element(s) 1804, storage 1806, a bus 1808, one or more network processor unit(s) 1810 interconnected with one or more network input/output (I/O) interface(s) 1812, one or more I/O interface(s) 1814, and control logic 1820. In various embodiments, instructions associated with logic for computing device 1800 can overlap in any manner and are not limited to the specific allocation of instructions and/or operations described herein.

In at least one embodiment, processor(s) 1802 is/are at least one hardware processor configured to execute various tasks, operations and/or functions for computing device 1800 as described herein according to software and/or instructions configured for computing device 1800. Processor(s) 1802 (e.g., a hardware processor) can execute any type of instructions associated with data to achieve the operations detailed herein. In one example, processor(s) 1802 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, memory element(s) 1804 and/or storage 1806 is/are configured to store data, information, software, and/or instructions associated with computing device 1800, and/or logic configured for memory element(s) 1804 and/or storage 1806. For example, any logic described herein (e.g., control logic 1820) can, in various embodiments, be stored for computing device 1800 using any combination of memory element(s) 1804 and/or storage 1806. Note that in some embodiments, storage 1806 can be consolidated with memory element(s) 1804 (or vice versa), or can overlap/exist in any other suitable manner.

In at least one embodiment, bus 1808 can be configured as an interface that enables one or more elements of computing device 1800 to communicate in order to exchange information and/or data. Bus 1808 can be implemented with any architecture designed for passing control, data and/or information between processors, memory elements/storage, peripheral devices, and/or any other hardware and/or software components that may be configured for computing device 1800. In at least one embodiment, bus 1808 may be implemented as a fast kernel-hosted interconnect, potentially using shared memory between processes (e.g., logic), which can enable efficient communication paths between the processes.

In various embodiments, network processor unit(s) 1810 may enable communication between computing device 1800 and other systems, entities, etc., via network I/O interface(s) 1812 to facilitate operations discussed for various embodiments described herein. In various embodiments, network processor unit(s) 1810 can be configured as a combination of hardware and/or software, such as one or more Ethernet driver(s) and/or controller(s) or interface cards, Fibre Channel (e.g., optical) driver(s) and/or controller(s), and/or other similar network interface driver(s) and/or controller(s) now known or hereafter developed to enable communications between computing device 1800 and other systems, entities, etc. to facilitate operations for various embodiments described herein. In various embodiments, network I/O interface(s) 1812 can be configured as one or more Ethernet port(s), Fibre Channel ports, and/or any other I/O port(s) now known or hereafter developed. Thus, the network processor unit(s) 1810 and/or network I/O interface(s) 1812 may include suitable interfaces for receiving, transmitting, and/or otherwise communicating data and/or information in a network environment.

interface(s) 1814 allow for input and output of data and/or information with other entities that may be connected to computing device 1800. For example, I/O interface(s) 1814 may provide a connection to external devices such as a keyboard, keypad, a touch screen, and/or any other suitable input and/or output device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a computer monitor, a display screen, or the like.

In various embodiments, control logic 1820 can include instructions that, when executed, cause processor(s) 1802 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 1820) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software (potentially inclusive of object code and source code), etc.) for execution by one or more processor(s), and/or other similar machine, etc. Generally, memory element(s) 1804 and/or storage 1806 can store data, software, code, instructions (e.g., processor instructions), logic, parameters, combinations thereof, and/or the like used for operations described herein. This includes memory element(s) 1804 and/or storage 1806 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™, mm·wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

In various example implementations, entities for various embodiments described herein can encompass network elements (which can include virtualized network elements, functions, etc.) such as, for example, network appliances, forwarders, routers, servers, switches, gateways, bridges, load balancers, firewalls, processors, modules, radio receivers/transmitters, or any other suitable device, component, element, or object operable to exchange information that facilitates or otherwise helps to facilitate various operations in a network environment as described for various embodiments herein. Note that with the examples provided herein, interaction may be described in terms of one, two, three, or four entities. However, this has been done for purposes of clarity, simplicity and example only. The examples provided should not limit the scope or inhibit the broad teachings of systems, networks, etc. described herein as potentially applied to a myriad of other architectures.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

In sum, an apparatus is provided. The apparatus includes a multilayer printed circuit board comprising a stackup including an upper half of the stackup and a lower half of the stackup, the multilayer printed circuit board having a top exposed surface and a bottom exposed surface, a first trace and via structure, having one portion disposed on the top exposed surface and another portion disposed within the upper half of the stackup, a second trace and via structure, having one portion disposed on the top exposed surface and another portion disposed within the upper half of the stackup, and first electrical components and second electrical components disposed on the top exposed surface of the multilayer printed circuit board and associated, respectively, with the first trace and via structure and the second trace and via structure, wherein the first electrical components are mounted orthogonally with respect to the second electrical components.

The first vias of the first trace and via structure may be separated by a first distance and second vias of the second trace and via structure may be separated by a second distance that is less than the first distance The first traces of the first trace and via structure may pass between the second vias of the second trace and via structure, and second traces of the second trace and via structure may pass between the first vias of the first trace and via structure.

The first trace and via structure may only be disposed in the upper half of the stackup, and the second trace and via structure may only be disposed only in the upper half of the stackup.

The apparatus may further include a third trace and via structure, having one portion disposed on the bottom exposed surface and another portion disposed within the lower half of the stackup, a fourth trace and via structure, having one portion disposed on the bottom exposed surface and another portion disposed within the lower half of the stackup, and third electrical components and fourth electrical components disposed on the bottom exposed surface of the multilayer printed circuit board and associated, respectively, with the third trace and via structure and the fourth trace and via structure, wherein at least one of the third electrical components and the fourth electrical components are mounted orthogonally to the first electrical components The third trace and via structure and fourth trace and via structure may be disposed (e.g., directly) opposite the first trace and via structure and the second trace and via structure.

The third trace and via structure and fourth trace and via structure may be disposed opposite, and offset from, the first trace and via structure and the second trace and via structure.

At least one of the first electrical components, second electrical components, third electrical components, and fourth electrical components include capacitors.

The apparatus may further include a plurality of ground vias. The plurality of ground vias may be arranged with first vias of the first trace and via structure and second vias of the second trace and via structure to provide a ground-signal-signal-ground (GSSG) arrangement.

The first vias of the first trace and via structure and second vias of the second trace and via structure may be configured to carry differential signals.

In an embodiment, first vias of the first trace and via structure have a first length and second vias of the second trace and via structure have a second length shorter than the first length.

The apparatus may still further include a block of intermingled differential vias. The block of intermingled differential vias may include two pairs of differential vias arranged in a square pattern, with each via of each pair of differential vias centered on a respective vertex of the square pattern.

In another embodiment, a method is provided. The method may include routing, on a first internal layer of a printed circuit board, a first pair of traces from a first trace and via structure between vias of a second trace and via structure, routing, on a second internal layer of the printed circuit board, a second pair of traces from the second trace and via structure between vias of the first trace and via structure, backdrilling the vias of the first trace and via structure to a first depth, and backdrilling the vias of the second trace and via structure to a second depth that is deeper than the first depth.

The method may further include mounting first capacitors in a first direction on the printed circuit board and electrically connected to the first trace and via structure, and mounting second capacitors in a second direction, orthogonal to the first direction, on the printed circuit board and electrically connected to the second trace and via structure.

In still another embodiment, an apparatus includes a multilayer printed circuit board comprising a stackup of layers including an upper half of the stackup and a lower half of the stackup, the multilayer printed circuit board having a top exposed surface and a bottom exposed surface, and an array of blocks of intermingled differential vias disposed in the multilayer printed circuit board.

In an implementation, each block in the array of blocks of intermingled differential vias includes two pairs of differential vias arranged in a square pattern, with each via of each pair of differential vias centered on a respective vertex of the square pattern.

The apparatus may further include ground vias that extend between the top exposed surface and the bottom exposed surface, the ground vias being spaced symmetrically around each block in the array of blocks of intermingled differential vias. A signal via-to-ground via (S:G via) ratio is up to 72:16.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus comprising:
a multilayer printed circuit board comprising a stackup including an upper half of the stackup and a lower half of the stackup, the multilayer printed circuit board having a top exposed surface and a bottom exposed surface;
a first trace and via structure, having one portion disposed on the top exposed surface and another portion disposed within the upper half of the stackup;
a second trace and via structure, having one portion disposed on the top exposed surface and another portion disposed within the upper half of the stackup; and
first electrical components and second electrical components disposed on the top exposed surface of the multilayer printed circuit board and associated, respectively, with the first trace and via structure and the second trace and via structure,
wherein the first electrical components are mounted orthogonally with respect to the second electrical components,
wherein first vias of the first trace and via structure are separated by a first distance and second vias of the second trace and via structure are separated by a second distance that is less than the first distance,
wherein first traces of the first trace and via structure pass between the second vias of the second trace and via structure, and second traces of the second trace and via structure pass between the first vias of the first trace and via structure, wherein the first electrical components overlie the second traces of the second trace and via structure, and wherein the first traces of the first trace and via structure exposed on the top exposed surface, and to which the first electrical components are connected, are orthogonal to the second traces of the second trace and via structure.

2. The apparatus of claim 1, wherein the first trace and via structure is disposed only in the upper half of the stackup, and the second trace and via structure is disposed only in the upper half of the stackup.

3. The apparatus of claim 1, further comprising:
a third trace and via structure, having one portion disposed on the bottom exposed surface and another portion disposed within the lower half of the stackup;
a fourth trace and via structure, having one portion disposed on the bottom exposed surface and another portion disposed within the lower half of the stackup; and
third electrical components and fourth electrical components disposed on the bottom exposed surface of the multilayer printed circuit board and associated, respectively, with the third trace and via structure and the fourth trace and via structure,
wherein at least one of the third electrical components and the fourth electrical components are mounted orthogonally to the first electrical components.

4. The apparatus of claim 3, wherein the third trace and via structure and fourth trace and via structure are disposed opposite the first trace and via structure and the second trace and via structure.

5. The apparatus of claim 3, wherein the third trace and via structure and fourth trace and via structure are disposed opposite, and offset from, the first trace and via structure and the second trace and via structure.

6. The apparatus of claim 1, wherein at least one of the first electrical components, second electrical components, third electrical components, and fourth electrical components comprise capacitors.

7. The apparatus of claim 1, further comprising a plurality of ground vias.

8. The apparatus of claim 7, wherein the plurality of ground vias are arranged with first vias of the first trace and via structure and second vias of the second trace and via structure to provide a ground-signal-signal-ground (GSSG) arrangement.

9. The apparatus of claim 1, wherein first vias of the first trace and via structure and second vias of the second trace and via structure carry differential signals.

10. The apparatus of claim 1, wherein first vias of the first trace and via structure have a first length and second vias of the second trace and via structure have a second length shorter than the first length.

11. The apparatus of claim 1, further comprising a block of intermingled differential vias.

12. The apparatus of claim 11, wherein the block of intermingled differential vias comprises two pairs of differential vias arranged in a square pattern, with each via of each pair of differential vias centered on a respective vertex of the square pattern.

13. The apparatus of claim 1, wherein vias of the first race and via structure are backdrilled to a first depth; and
vias of the second trace and via structure are backdrilled to a second depth that is deeper than the first depth.

14. An apparatus comprising:
a multilayer printed circuit board comprising a stackup including an upper half of the stackup and a lower half of the stackup, the multilayer printed circuit board having a top exposed surface and a bottom exposed surface;
a first trace and via structure, having one portion disposed on the top exposed surface and another portion disposed within the upper half of the stackup;
a second trace and via structure, having one portion disposed on the top exposed surface and another portion disposed within the upper half of the stackup; and
first electrical components and second electrical components disposed on the top exposed surface of the multilayer printed circuit board and associated, respectively, with the first trace and via structure and the second trace and via structure,
wherein the first electrical components are mounted to traces that are arranged orthogonally to, and that overlie, traces in the second trace and via structure that are disposed within the upper half of the stackup.

* * * * *

UNITED STATES PATENT AND TRADEMARK OFFICE
CERTIFICATE OF CORRECTION

| | | |
|---|---|---|
| PATENT NO. | : 11,785,706 B2 | Page 1 of 1 |
| APPLICATION NO. | : 17/335591 | |
| DATED | : October 10, 2023 | |
| INVENTOR(S) | : Shadi Ebrahimi Asl et al. | |

It is certified that error appears in the above-identified patent and that said Letters Patent is hereby corrected as shown below:

In the Claims

Claim 13, Column 16, Line 19, please replace "wherein vias of the first race" with --wherein vias of the first trace--

Signed and Sealed this
Twenty-seventh Day of August, 2024

Katherine Kelly Vidal
*Director of the United States Patent and Trademark Office*